United States Patent
Yamazaki et al.

(10) Patent No.: US 8,664,533 B2
(45) Date of Patent: Mar. 4, 2014

(54) SUBSTRATE HAVING TRANSPARENT CONDUCTIVE LAYER, METHOD FOR PRODUCING SAME, TRANSPARENT CONDUCTIVE FILM LAMINATE FOR TOUCH PANEL, AND TOUCH PANEL

(75) Inventors: Yoshikazu Yamazaki, Saitama (JP); Satoshi Hayakawa, Saitama (JP); Miho Yokokawa, Saitama (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/808,505

(22) PCT Filed: Jul. 4, 2011

(86) PCT No.: PCT/JP2011/065261
§ 371 (c)(1),
(2), (4) Date: Mar. 22, 2013

(87) PCT Pub. No.: WO2012/005205
PCT Pub. Date: Jan. 12, 2012

(65) Prior Publication Data
US 2013/0168138 A1    Jul. 4, 2013

(30) Foreign Application Priority Data
Jul. 5, 2010   (JP) .................................. 2010-152946
Jul. 5, 2010   (JP) .................................. 2010-152947

(51) Int. Cl.
*H05K 1/00*   (2006.01)
(52) U.S. Cl.
USPC ............... 174/253; 428/73; 438/172; 349/43; 345/76; 257/53
(58) Field of Classification Search
USPC ............... 174/253; 428/73; 438/172; 349/43; 345/76; 257/53
See application file for complete search history.

(56) References Cited

U.S. PATENT DOCUMENTS

| 4,999,693 | A | * | 3/1991 | Yamazaki et al. | 257/53 |
| 5,039,620 | A | * | 8/1991 | Yamazaki et al. | 438/73 |
| 5,164,322 | A | * | 11/1992 | Yamazaki et al. | 438/73 |
| 2001/0010566 | A1 | * | 8/2001 | Izumi et al. | 349/43 |
| 2006/0022910 | A1 | * | 2/2006 | Sekiya et al. | 345/76 |
| 2010/0247870 | A1 | * | 9/2010 | Suzuki et al. | 428/172 |

FOREIGN PATENT DOCUMENTS

| JP | 2008-098169 A | 4/2008 |
| JP | 2008-290354 A | 12/2008 |

(Continued)

OTHER PUBLICATIONS

International Search Report of PCT/JP2011/065261, mailing date of Oct. 4, 2011.

*Primary Examiner* — Xiaoliang Chen
(74) *Attorney, Agent, or Firm* — Westerman, Hattori, Daniels & Adrian, LLP

(57) ABSTRACT

A substrate having a transparent conductive layer has a transparent conductive pattern that is not easily visually recognizable by a naked human eye on a transparent substrate and can be formed by a simple and efficient method. In the case where a transparent conductive pattern is formed on a transparent substrate, the pattern region does not include conductive regions covered with uniform transparent conductive films or a high-resistance region that is not covered with the transparent conductive film, the high-resistance region electrically insulating the conductive regions. Instead of the conductive regions or the high-resistance region, the inventors use a region having a structure including a mixture of a portion covered with the transparent conductive film and a portion not covered with the transparent conductive film, thereby solving the foregoing visual recognition issue.

25 Claims, 11 Drawing Sheets

(56) References Cited

FOREIGN PATENT DOCUMENTS

| JP | 2010-044968 A | 2/2010 |
|---|---|---|
| JP | 2010-076232 A | 4/2010 |
| JP | 2010-140859 A | 6/2010 |
| JP | 2010-146283 A | 7/2010 |
| WO | 01/27868 A1 | 4/2001 |
| WO | 2006/126604 A1 | 11/2006 |

* cited by examiner

SUBSTRATE HAVING TRANSPARENT CONDUCTIVE LAYER, METHOD FOR PRODUCING SAME, TRANSPARENT CONDUCTIVE FILM LAMINATE FOR TOUCH PANEL, AND TOUCH PANEL

TECHNICAL FIELD

The present invention relates to a substrate having a transparent conductive layer, the substrate having a transparent conductive layer with a patterned transparent conductive region on a transparent substrate, in which the transparent conductive region and other regions have very similar optical properties, so the transparent conductive region is not optically visualized, and relates to a touch panel produced by bonding the substrates having transparent conductive layers. In particular, the present invention relates to a film having a transparent conductive layer, the film being a transparent film substrate as the foregoing substrate, and to a film having a transparent conductive layer used for the production of a capacitive touch panel. Furthermore, the present invention relates to methods for producing the substrate having a transparent conductive layer and the film having a transparent conductive layer, a transparent conductive film laminate for a touch panel, the laminate being produced by bonding the substrates having transparent conductive layers or the films having transparent conductive layers, and a touch panel having satisfactory viewability, the touch panel being produced from the substrate having a transparent conductive layer or the film having a transparent conductive layer.

BACKGROUND ART

Various substrates having transparent conductive layers, in which transparent conductive layers are provided on transparent substrates, and various films having transparent conductive layers are used as important functional components in, for example, electronic devices that utilize a light-emitting or light-receiving function. In particular, with widespread use of mobile computing devices, there have recently been advances in touch panel technology supporting a "user-friendly" graphical user interface". Functional members used for the devices become important. In particular, a member including two-dimensionally arranged minute transparent electrodes formed by patterning a transparent conductive layer and a member including two-dimensionally arranged minute capacitive elements formed by stacking such patterned transparent conductive layers function as switches that can detect the contact position by detecting conduction or a change in capacitance due to contact with individual transparent electrodes. Functional members including substrates and films having patterned transparent conductive layers and having functions, such as electrodes and switches, are often used as materials for touch panels which combines displays and input means in electronic equipment, such as personal digital assistants (PDAs), notebook PCs, OA equipment, medical equipment, and car-navigation systems. Furthermore, such functional members are indispensable members for slimming down and miniaturization of the above-mentioned electronic devices.

In particular, regarding the touch-panel technology, many capacitive touch panels which are attached on displays, such as liquid crystal panels and CRTs, and which detect a position touched by an observer are known (see PTL 1).

Typically, such substrates having patterned transparent conductive layers are produced by patterning transparent conductive layers by etching or laser ablation, transparent conductive layers being formed by the evaporation of a metal oxide, e.g., ITO or ATO. Hitherto, in capacitive touch panels attached to displays described above, ITO has been used as a transparent conductive film material for sensor electrodes of touch panels. Meanwhile, attempts are made to provide alternatives thereto. Furthermore, possible application processes of mass production at low cost are also studied. Examples of such processes that have been developed include methods in which conductive coating materials containing, for example, conductive particles or conductive nanowires, as a conductive substance are applied to directly form patterns; and methods in which uniform conductive coating films are formed, and then patterns are formed through various patterning steps suitable for the formed coating films. A conductive pattern-covered substrate and a method of manufacturing the same is disclosed, the method including a step of distributing conductive microfibers crossing one another without aggregating or entangling them to form conductive fiber films which electrically contact one another at their crossing portions; and a step of irradiating the conductive fiber films at their desired positions with laser light to partially break or eliminate the conductive microfibers, thereby forming conductive pattern portions (see PTL 2).

In the case where the substrates having transparent conductive layers and having electrode and switching functions are used as materials for touch panels and so forth, images on displays and the like are seen through the substrates having transparent conductive layers. Thus, irrespective of which production method described above is used, it is significantly important not to visualize formed patterns. If these patterns are recognized by a difference in optical properties between a pattern formation portion configured to, for example, electrodes and switches, and a pattern-free portion on a substrate having a transparent conductive layer, satisfactory viewability of an image on, for example, a display behind the substrate having a transparent conductive layer can be reduced.

In particular, in the case where a touch panel in which a substrate or film having a transparent conductive layer and having electrode and switch functions is arranged all over a display and which receives light incidence from a high-luminance image and the external environment, electrode and switch patterns are easily visualized by only slight differences in light transmittance, reflectance, haze, and so forth, thus causing a reduction in the viewability of an image on, for example, a display.

In particular, in the case of a transparent conductive film of a fibrous conductive substance, in which rapid progress has been made in the development of the formation of a transparent conductive film by application, as a conductive substance alternative to ITO for a transparent conductive film, since it is possible to form a conductive film by application, the production efficiency is high, advantageously reducing cost, compared with conventional transparent conductive films of ITO. In addition, the transparent conductive film advantageously has low resistance and high transmittance. However, there is a problem in which a difference in haze due to fibrous conductive substance is easily visualized.

An example of a method for preventing the visualization of a transparent conductive layer pattern of a substrate or film having a transparent conductive layer is a method in which a high-resistance coating film having similar optical properties is formed in a conductive layer-free region of the substrate. For example, a transmittance-adjusting region is formed in a non-pattern formation region in such a manner that the transmission spectrum of light passing through a pattern formation region where a transparent conductive film is formed and the transmission spectrum or reflectance of light passing through the non-pattern formation region where no transparent conductive film is formed are approximated (see PTLs 3 and 4). A solution of a synthetic resin dispersed in water, a solution of paste and ammonium chloride dispersed in water, or a solution of ferric chloride and cupric chloride dispersed in water is applied onto a predetermined portion of an upper surface of a conductive layer, so that silver in the conductive layer is converted into insulating silver chloride to form an insulating portion, instead of forming an insulating portion by removing silver, which is a conductive substance. Thereby, the difference in optical properties between a conductive portion and the insulating portion is reduced (see PTL 5).

However, in these techniques, after the transparent conductive film pattern or the transparent conductive film is formed, the transmittance-adjusting layer is separately formed in the region where no transparent conductive film is formed, or the insulating portion is formed in part of the transparent conductive film. In these cases, the production process is complicated. Furthermore, in the methods described in PTLs 3 and 4, the transmittance-adjusting region is required to be precisely formed in the portion where the transparent conductive pattern is not formed. The registration is difficult. In the case of using the chloride solution as described in PTL 5, there is a problem of the reaction of silver in the pattern formation region of the transparent conductive film inherently having satisfactory conductivity which should be maintained.

Meanwhile, a method is exemplified as follows: A conductive region similar to other conductive regions is formed in a non-formation region where no conductive pattern is originally formed, so that a narrow non-formation region, which is not easily visually recognized between other conductive regions, is formed, thereby forming an isolated pattern region electrically insulated from other conductive regions. For example, after conductive fiber films are formed using conductive microfibers, desired positions are irradiated with laser light to partially break or eliminate the conductive microfibers, thereby forming isolated conductive regions insulated from other conductive regions (see PTL 2). PTL 2 discloses a conductive pattern-covered substrate and a method of manufacturing the same, the method including a step of distributing conductive microfibers crossing one another without aggregating or entangling them to form conductive fiber films which electrically contact one another at their crossing portions; and a step of irradiating the conductive fiber films at their desired positions with laser light to partially break or eliminate the conductive microfibers, thereby forming conductive pattern portions. In this method, a non-conductive pattern portion also contains microfibers and a binder which are the same components as in the conductive pattern-covered substrate. Thus, the optical properties, such as a hue, light transmittance, and a haze value, of the conductive pattern portions and the non-conductive pattern portions are identical. No difference is visually recognized. The conductive pattern is not easily visually recognized. Such an isolated pattern region has the same optical properties as other conductive regions. Thus, no difference in optical properties is visually recognized. The non-formation region, which is a boundary between the isolated pattern region and the conductive region, is small in width. Thus, the boundary itself is not visually recognized. The isolated pattern region is a non-formation region and insulated from other conductive regions. Thus, the isolated pattern region has the same electrical function as the non-formation region.

The pattern formation of the non-formation region, which functions as an insulating portion, of the transparent conductive film is very effective when the conductive pattern is formed by a precise pattern formation method, for example, photolithography or laser processing. However, it is often difficult to form the isolated pattern region by a usual pattern formation method in such a manner that a visually unrecognizable width between the conductive region and the isolated pattern region is achieved and that both regions are reliably insulated from each other. In particular, in the case where an application step is used to form the conductive pattern, it is difficult to precisely form the foregoing non-formation region having a narrow width. For example, in the case where the conductive pattern is formed through an application step using a conductive coating material, it is impossible to form the foregoing isolated pattern region. In this method, the optical properties of the isolated pattern region are substantially equal to those of the formation region of the transparent conductive film. In addition, the method does not have the function of adjusting the optical properties. In this case, when a plurality of substrates or films having transparent conductive layers are bonded together as with the formation of a capacitive touch panel, in a portion where the formation regions of the transparent conductive films in the non-conducting pattern portions are superimposed, the optical transmittance can be markedly reduced to disadvantageously cause the pattern to be easily visually recognized, compared with, for example, a portion where the formation regions of the transparent conductive films in the conductive pattern portions are not superimposed.

For example, in the case where the foregoing method is employed for an X-Y type touch panel described in PTL 1, a transparent electrode portion formed of a conductive microfiber film of an X-axis trace of an X sensor array and a conductive microfiber film of a Y-axis trace of a Y sensor array are each irradiated with laser light to partially break or eliminate the conductive microfibers, thereby forming non-conductive portions which are electrically noncontact. In the case where non-conductive pattern portions where isolated conductive microfibers are left are superimposed, although the visual recognition of the pattern of each of the non-conductive pattern portions before superimposition is satisfactory, the hue, the light transmittance, and the haze value are clearly degraded, thereby disadvantageously degrading the image quality of a display device observed through the touch panel. The viewability is not improved but can be degraded, compared with a common method in which the conductive microfiber film is completely removed to form a non-conductive portion.

Usually, in the case where a transparent substrate or transparent film substrate having a patterned transparent conductive layer is used as a material for, for example, a touch panel, transparent conductive substrates, transparent conductive films, substrates or films having patterned transparent conductive layers are often combined and laminated before use. It is good if a pattern is not visually recognized in the overall laminate. Thus, even if a pattern of a substrate having a patterned transparent conductive layer is visually recognized, a substrate having a transparent conductive layer with a pattern that offsets the visual recognition may be stacked to prevent the conductive pattern from being visually recognized. However, a finer pattern formed requires higher precision of registration at the time of lamination.

For example, capacitive touch panels have problems with visual recognition as described below.

An X-Y type touch panel, which is often used in capacitive touch panels, includes a plurality of Y electrodes which extend in a first direction (for example, Y direction) and which are arranged in the second direction (for example, X direction) intersecting with the first direction; and a plurality of X electrodes which intersect with the Y electrodes, which extend in the second direction, and which are arranged in the first direction.

In the X-Y type touch panel, the capacitance of 1 line electrode in a state in which the panel is not in contact with a finger or the like (stationary state) consists of the interelectrode capacitance between adjacent electrodes, the intersection capacitance formed at intersections of the electrodes, the earth capacitance between the line and a display device arranged under the touch panel, and the wiring capacitance produced in wiring between a control IC and the touch panel. A change in interelectrode capacitance caused by touching the touch panel with observer's finger or the like is sensed to detect the position coordinates touched by the observer.

The capacitance other than the interelectrode capacitance is preferably lower. It is preferred that the area of the intersection of X and Y electrodes is designed as low as possible. To achieve sufficient position resolution, the distance between the electrodes is minimized as long as a short-circuit between adjacent electrodes does not occur.

The X electrodes and the Y electrodes are usually formed on different transparent insulating substrates. To achieve sufficient resolution, when the X electrodes and the Y electrodes are stacked, preferably, adjacent X and Y electrodes do not overlap, and uniform appearance is provided. Thus, in order to prevent adjacent X and Y electrodes from overlapping, gaps where no electrode is present are provided in a stack of the X electrodes and the Y electrodes.

In this case, in a pattern containing a fibrous transparent conductive substance in a transparent conductive layer, conductive pattern portions where electrode portions containing the fibrous transparent conductive substance are formed differ in hue, light transmittance, and haze value from gap portions where the electrode portion is not present. Thus, the gap portion present between two conductive pattern portions is clearly visually recognized. When the X electrodes and the Y electrodes, each extending in one direction, are orthogonally bonded together, the crossing portions of the conductive films of linking portions that connect the electrodes to each other are inevitably formed. The difference in optical properties occurs between the crossing portions and portions of the conductive pattern portions that are not crossed. In particular, the haze value of the conductive pattern portions is higher than that of the non-conductive pattern portions that do not contain microfibers because of light scattering due to the microfibers. That is, the difference in haze value occurs between the conductive pattern portions and the gap portions or between the conductive pattern portions where the crossing of the conductive films is not formed and the linking portions where the crossing occurs. For this reason, there are the problems with visual recognition in applications, such as touch panels, liquid crystal displays, and organic EL displays (see FIGS. 15, 16, and 17).

CITATION LIST

Patent Literature

PTL 1: International Publication No. WO2001-027868
PTL 2: Japanese Unexamined Patent Application Publication No. 2010-044968
PTL 3: International Publication No. WO2006/126604
PTL 4: Japanese Unexamined Patent Application Publication No. 2008-098169
PTL 5: Japanese Unexamined Patent Application Publication No. 2008-290354

SUMMARY OF THE INVENTION

It is an object of the present invention to provide a substrate having a transparent conductive layer or a film having a transparent conductive layer, the substrate or film having a transparent conductive pattern on a transparent support, the pattern being not easily visually recognized, and to provide a method for producing the substrate having a transparent conductive layer or the film having a transparent conductive layer, the substrate or film being able to be formed by a simpler and efficient method, such as an application process or a printing process, without using a precise pattern formation method, for example, photolithography or laser processing, or a need for precise registration. It is another object of the present invention to provide a method for the transparent conductive layer pattern on the transparent support by employing the simple and efficient method, the pattern being not easily visually recognized. It is another object of the present invention to provide, by using the substrate having a transparent conductive layer, the substrate having the transparent conductive layer pattern, a substrate or film having a transparent conductive layer for a touch panel, a transparent conductive film laminate for a touch panel, and a touch panel, the pattern being not easily visually recognized.

More specifically, it is an object of the present invention to provide a substrate having a transparent conductive layer or a film having a transparent conductive layer using conductive fiber films as a transparent conductive film material for an electrode of a touch panel, instead of conventional ITO, the conductive fiber films being formed by distributing conductive microfibers crossing one another without aggregating or entangling conductive microfibers, and the conductive fiber films electrically contacting one another at their crossing portions, in which when an X-Y type touch panel is formed, conductive pattern portions and non-conductive pattern portions are not easily recognized while the hue, the light transmittance, and the haze value are not degraded. In particular, it is another object of the present invention to provide a substrate film having a transparent conductive layer, in which when the substrates or films having transparent conductive layers are superimposed in such a manner that electrode portions of the conductive pattern are not superimposed on each other, the difference of the optical properties of gap portions formed between two conductive pattern portions is not visually recognized.

In the case where a transparent conductive pattern is formed on a transparent substrate, the pattern region does not include conductive regions covered with uniform transparent conductive films or a high-resistance region that is not covered with the transparent conductive film, the high-resistance region electrically insulating the conductive regions. The inventors have found that instead of the high-resistance region, a region having a structure including a mixture of a portion covered with the transparent conductive film and a portion not covered with the transparent conductive film is used and that the region is used in place of the high-resistance region that is not covered with the transparent conductive film at all in the related art, thereby solving the foregoing visual recognition issue more easily and efficiently. The findings have led to the completion of the present invention.

The present invention provides a substrate having a transparent conductive layer, the substrate including the transparent conductive layer having a pattern on a transparent substrate or a transparent film substrate, the transparent conductive layer being formed of a transparent conductive film containing a binder resin and a conductive substance, in which the transparent conductive layer includes conductive regions (A) uniformly covered with the transparent conductive film and a high-resistance region (B) provided between the transparent conductive regions (A), in which the high-resistance region (B) includes subregions (C) covered with the transparent conductive films and subregions (D) not covered with the transparent conductive film, the subregions (C) and the subregions (D) being located in the high-resistance region (B), and in which the subregions (C) and/or subregions (D) form a two-dimensional arrangement having a fine period or size that is not visually recognized.

The present invention provides a method for producing a substrate or film having a transparent conductive layer, the substrate or film including the transparent conductive layer with a pattern on a transparent substrate or a transparent film substrate, the transparent conductive layer being formed of a transparent conductive film containing a binder resin and a conductive substance, the method including applying a coating material for a transparent conductive layer onto a transparent substrate or printing an ink for a transparent conductive layer onto a transparent substrate using a plate, in which the transparent conductive layer includes conductive regions (A) uniformly covered with the transparent conductive film and a high-resistance region (B) provided between the transparent conductive regions, in which the high-resistance region (B) includes subregions (C) covered with the transparent conductive films and subregions (D) not covered with the transparent conductive film, in which the subregions (C) and/or subregions (D) form a two-dimensional arrangement pattern having a fine period or size that is not visually recognized, and in which the plate includes a portion configured to perform printing for the regions (A) and a portion configured to perform printing for a region including the subregions (C) and the subregions (D) in the region (B).

The present invention provides a method for producing a substrate or film having a transparent conductive layer, the substrate or film including the transparent conductive layer with a pattern on a transparent substrate or a transparent film substrate, the transparent conductive layer being formed of a transparent conductive film containing a binder resin and a conductive substance, the method including forming the transparent conductive film on the entire surface of the transparent substrate and detaching an unnecessary portion from the transparent conductive layer using a detachment base including an adhesive layer on a substrate, the adhesive layer having a pattern that is the inverse, in terms of negative and positive portions, of the pattern of the transparent conductive layer, in which the transparent conductive layer includes conductive regions (A) uniformly covered with the transparent conductive film and a high-resistance region (B) provided between the transparent conductive regions, in which the high-resistance region (B) includes subregions (C) covered with the transparent conductive films and subregions (D) not covered with the transparent conductive film, in which the subregions (C) and/or subregions (D) form a two-dimensional arrangement pattern having a fine period or size that is not visually recognized, and in which in the production of the detachment base, the adhesive layer is formed on the substrate by application or printing with a plate including portions configured to perform printing for a negative pattern of the conductive regions (A) and a region including the subregions (C) and the subregions (D).

The present invention provides a transparent conductive film laminate for a touch panel, the transparent conductive film laminate including the substrates having transparent conductive layers or the films having transparent conductive layers described above, the substrates or films being orthogonally bonded together.

The present invention provides a capacitive touch panel including the transparent conductive film laminate described above.

According to the present invention, a substrate having a transparent conductive layer includes the transparent conductive layer having a repetitive pattern, the transparent conductive layer being formed of a transparent conductive film containing a binder resin and a conductive substance, in which the transparent conductive layer includes conductive regions (low resistance regions) (A) uniformly covered with the transparent conductive film and a high-resistance region (B) provided between adjacent transparent conductive regions, in which the high-resistance region is a mixed region includes regions covered with the transparent conductive film and regions not covered with the transparent conductive film, i.e., the high-resistance region includes subregions (C) covered with the transparent conductive films and subregions (D) not covered with the transparent conductive film, and in which the subregions (C) and/or subregions (D) are isolated subregions that form a two-dimensional arrangement pattern having a fine period or size that is not visually recognized. Alternatively, the subregions (C) and/or the subregions (D) are subregions where the foregoing subregions are partially connected to each other. In the high-resistance region (B), by adjusting the distribution, shape, and the linking state of the subregions (C) and the subregions (D), high-resistance performance is achieved while the conductive film is formed. Thus, the optical properties can be brought close to the optical properties of the conductive regions, compared with the case where the high-resistance region (B) is formed of a nonformation region that are not covered with the transparent conductive film at all. Therefore, the transparent conductive pattern is not easily visually recognized. Furthermore, when the high-resistance region (B) has the two-dimensional arrangement pattern having a fine period that is not visually recognized, the optical properties in the overall regions are uniform in appearance. The electrical properties and optical properties of the high-resistance region (B) can be adjusted by adjusting the distribution and shape of the subregions (C) and the subregions (D) that form it.

In the case where the transparent substrate is a transparent film substrate, the film having a transparent conductive layer is produced by applying a coating material for a transparent conductive layer onto a transparent substrate or printing an ink for a transparent conductive layer onto a transparent substrate using a plate that includes a portion configured to perform printing for the regions (A) and a portion configured to perform printing for a region including the subregions (C) and the subregions (D) in the region (B). Thereby, the pattern can be formed simultaneously and easily on the transparent film substrate to form a transparent conductive pattern more easily. The pattern includes conductive regions (A) uniformly covered with the transparent conductive film and a high-resistance region (B). The high-resistance region (B) includes subregions (C) covered with the transparent conductive films and subregions (D) not covered with the transparent conductive film. The subregions (C) and/or subregions (D) are isolated subregions that form a two-dimensional arrangement pattern having a fine period or size that is not recognized by the naked eye. Alternatively, the subregions (C) and/or the subregions (D) are subregions where the foregoing subregions are partially connected to each other.

The transparent conductive film is formed on the entire surface of the transparent substrate or transparent film substrate. A detachment base, such as a detachment film, is prepared, the detachment base including an adhesive layer on a support, the adhesive layer having a pattern that is the inverse, in terms of negative and positive portions, of a repetitive pattern to be formed. The adhesive layer is bonded by pressure to the transparent conductive film and then detached therefrom. The adhesive layer is formed on the substrate by application or printing with a plate including portions configured to perform printing for a negative pattern of the conductive regions (A) and a region including the subregions (C) and the subregions (D) in the high-resistance region (B). Thereby, the transparent conductive layer can be basically formed by a method of application or printing even if a coating material or an ink for a transparent conductive layer has properties in which it is difficult to form a pattern of the transparent conductive layer on the transparent substrate or transparent film substrate by a usual method of direct application or printing on the transparent substrate or transparent film substrate.

When a substrate having a transparent conductive layer is used, the viewability of, for example, a transparent conductive film laminate for a touch panel, the laminate being formed by superimposing them, is also improved. That is, in the case where, like a capacitive touch panel, substrates having patterned transparent conductive layers are superimposed together before use, the optical properties, such as the light transmittance and the haze value, of regions where the transparent conductive layers are superimposed together are adjusted in advance by the same method while maintaining the conductivity the regions to be superimposed. In this way, it is possible to prevent the fact that the superimposed pattern is visualized by markedly different optical properties from adjacent portions when the regions are superimposed. With respect to regions where the transparent conductive layers are not superimposed at all, the optical properties of the regions are adjusted in such a manner that the difference in optical properties between the regions and adjacent portions when the regions are superimposed is not increased, while maintaining the insulation of the regions.

The substrate having a transparent conductive layer or the film having a transparent conductive layer of the present invention, the pattern on the transparent substrate being a transparent electrode pattern, may be a substrate or film having a patterned transparent conductive layer, which can be formed into a transparent conductive film laminate for a touch panel when the substrates or films having transparent conductive layers are orthogonally bonded together, the laminate being used for the production of a capacitive touch panel. In this case, the substrate or film having a transparent conductive layer includes, on a transparent substrate or transparent film substrate, a plurality of liner electrode line portions (a) extending in a fixed direction, the electrode line portions (a) being arranged in parallel to each other at regular intervals and being composed of a transparent conductive layer containing a fibrous conductive substance, and an electrode line-free portion (b), which is a high-resistance portion, provided between the electrode lines. The electrode line portions (a) include electrode portions (a1) arranged at regular intervals and linking portions (a2) configured to connect the electrode portions to each other. The transparent conductive layer includes a two-dimensional arrangement pattern is provided in a region (b1) of the electrode line-free portion (b) where the electrode line-free portions (b) are superimposed on each other when the substrates are orthogonally superimposed in such a manner that the electrode portions are not superimposed and that the linking portions are superimposed on each other, the two-dimensional arrangement pattern having a fine period or size that is not recognized by the naked eye.

With respect to a substrate having a patterned conductive layer used for an X-Y type capacitive touch panel, in a substrate covered with a conductive pattern for X electrodes and a substrate covered with a conductive pattern for Y electrodes, which form the X electrodes and the Y electrodes, a high-resistance region is formed using a conductive film composed of a transparent conductive film that forms the electrodes, the conductive film being arranged in portions corresponding to gaps where no electrode is present, the gap portions being located between the X electrodes and the Y electrodes of a touch panel in which both substrates are bonded together, the conductive film including subregions covered with the conductive film and subregions not covered with the conductive film, and the conductive film having a two-dimensional arrangement pattern with a period and/or size that is not easily recognized or that cannot be recognized by the naked eye.

Preferably, the optical properties of the two-dimensional arrangement pattern are adjusted in such a manner that the haze value of a region which is located in the gap portions between the electrodes and which has the two-dimensional pattern is equivalent to the haze value of electrode portions of the X and Y electrode portions when the substrate covered with a conductive pattern for X electrodes and the substrate covered with a conductive pattern for Y electrodes are bonded together. Thereby, a state in which the conductive patterns are least visually recognized can be achieved while maintaining satisfactory electrical properties and insulation properties as a touch panel.

Similarly, in a substrate having a conductive pattern for X electrodes and a substrate having a conductive pattern for Y electrodes used for an X-Y type touch panel, portions uncovered with the conductive film are provided in crossing portions located between the X electrodes and the Y electrodes of a touch panel in which both substrates are bonded together, the portions including subregions covered with the conductive film and subregions not covered with the conductive film, and the portions having a two-dimensional arrangement pattern with a period and/or size that is not easily recognized or that cannot be recognized by the naked eye. Thereby, the transparent conductive regions are formed. Preferably, the transparent conductive regions are formed in such a manner that the haze value of the transparent conductive region having, for example, dot-like uncovered portions corresponding to the foregoing crossing portions is equivalent to the haze value of the transparent conductive films of the X and Y electrode portions when the substrate covered with a conductive pattern for X electrodes and the substrate covered with a conductive pattern for Y electrodes are bonded together. Thereby, a state in which the conductive patterns are least visually recognized can be achieved.

Advantageous Effects of Invention

A substrate having a transparent conductive layer of the present invention includes a transparent conductive layer pattern on a transparent substrate. Although the substrate includes two regions, i.e., a conductive region and a high-resistance region, the difference in optical properties between the regions is small, so that the transparent conductive pattern is not easily recognized. A method of the present invention for producing a substrate having a transparent conductive layer does not require precise processing at the time of the formation of the transparent conductive pattern. A substrate or film having a transparent conductive layer can be formed only by a method including an application step or a printing step using a coating material for a transparent conductive layer or an ink for a transparent conductive layer, a patterned transparent conductive layer being provided on a transparent substrate or a transparent film substrate, and the transparent conductive layer pattern being not easily visually recognized.

In the case where conductive fiber films as a transparent conductive film material for a sensor electrode of a touch panel, instead of conventional ITO, are used, the conductive fiber films being formed by distributing conductive microfibers crossing one another without aggregating or entangling conductive microfibers, and the conductive fiber films electrically contacting one another at their crossing portions. In the case where the configuration of the present invention is used, the haze value of portions corresponding to gaps where no electrode is present, the gap portions being located between the X electrodes and the Y electrodes and crossing portions between the X electrodes and the Y electrodes can be substantially equal to the haze value of the electrode portions. Thus, it is possible to provide a touch panel including the pattern of the transparent conductive layer, the pattern being not easily recognized without degrading the hue, the light transmittance, or the haze value of the overall touch panel.

DETAILED DESCRIPTION OF THE INVENTION

Figure 1:
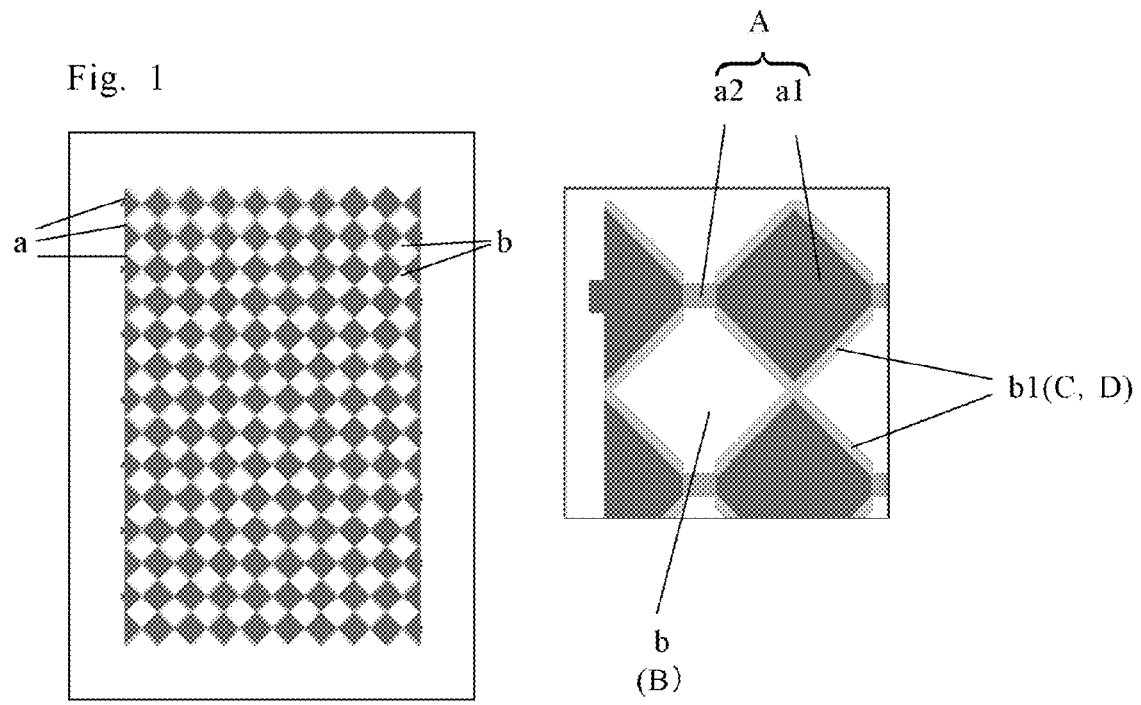
FIG. 1 is a schematic diagram of a substrate covered with a conductive pattern for X electrodes, the substrate serving as a substrate having a transparent conductive layer of the present invention.

A transparent conductive pattern of the present invention includes conductive regions (A) covered with a transparent conductive film and a high-resistance region (B) provided between the transparent conductive regions, in which the high-resistance region (B) includes subregions (C) covered with the transparent conductive films and subregions (D) not covered with the transparent conductive film, and in which the subregions (C) and/or subregions (D) form a two-dimensional arrangement pattern having a fine period or size that is not recognized by the naked eye.

In the present invention, a "substrate having a transparent conductive layer", a "film having a transparent conductive layer", a "substrate", a "film", and a "film substrate" are described in various sections. These expressions indicate that the substrate having a transparent conductive layer according to the present invention includes the film having a transparent conductive layer. In the present invention, the substrate having a transparent conductive layer is a broader term encompassing the film having a transparent conductive layer.

The high-resistance region of the present invention is not a high-resistance region, on which a conductive film is not provided, configured to separate the conductive regions covered with a conductive film. While the high-resistance region of the present invention has high resistance and electrically separates adjacent conductive regions, the high-resistance region of the present invention includes first portions covered with transparent conductive films and second portions not covered with the transparent conductive films in the high-resistance region. The first portions and/or the second portions are isolated regions that form a two-dimensional arrangement pattern having a fine period or size that is not recognized by the naked eye. Alternatively, the first portions and/or the second portions are regions where the foregoing portions are partially connected to each other. In the case where the high-resistance region is set to such a region, the surface resistance of the high-resistance region is reliably increased, compared with the conductive regions. The optical properties of the high-resistance region are brought close to those of the conductive regions, compared with the case where the high-resistance region is not covered with the conductive film at all. Since the two-dimensional arrangement pattern has a fine period or size that is not recognized by the naked eye, the high-resistance region (B) has uniform optical properties when viewed by the naked eye.

The subregions (C) and/or subregions (D) are isolated subregions that form the two-dimensional arrangement pattern having a fine period or size that is not recognized by the naked eye. Alternatively, the subregions (C) and/or the subregions (D) are subregions where the foregoing subregions are partially connected to each other. That is, the covered subregions (C) are isolated subregions, the circumference of each of the subregions (C) being surrounded by portions not covered with the transparent conductive film, and the subregions (C) being separated from other subregions (C) and the conductive regions (A). Alternatively, the subregions (C) can form subregions where the foregoing subregions are partially connected to each other. Alternatively, the uncovered subregions (D) are isolated subregions, the circumference of each of the subregions (D) being surrounded by portions covered with the transparent conductive film, and the subregions (D) being separated from other subregions (D) not covered and other transparent conductive films. Alternatively, the subregions (D) can form subregions where the foregoing subregions are partially connected to each other. In the two-dimensional arrangement pattern, at least one of the covered states may be formed, or both may be formed.

That is, in the case where the covered subregions (C) are isolated subregions that form the two-dimensional arrangement pattern having a fine period or size that is not recognized by the naked eye; or are subregions where the foregoing subregions are partially connected to each other, the subregions (C) are separated from each other or are present as subregions (C) partially connected, portions not covered with the transparent conductive film serving as the background. In the case where the uncovered subregions (D) are isolated subregions that form the two-dimensional arrangement pattern having a fine period or size that is not recognized by the naked eye; or are subregions where the foregoing subregions are partially connected to each other, the subregions are separated from each other or are present as subregions partially connected, portions covered with the transparent conductive film serving as the background.

When the plural subregions (C) and subregions (D) are present, various distribution states are present, depending on the size of each subregion, density, a distance from adjacent subregions, and so forth.

The value of the surface resistance governed by the distribution of the subregions depends on the conditions: either the covered subregions (C) or the uncovered subregions (D) are formed; both are formed; the proportion of the total covered subregions with respect to the entire high-resistance region; and the distribution state of the subregions (C) or subregions (D). To maintain the resistance of the high-resistance region at a high level, preferably, the subregions (C) covered with the transparent conductive films in the high-resistance region are separated from each other and present as isolated subregions, as much as possible. A smaller total area of the subregions (C) results in higher resistance, so that higher insulation can be stably achieved. However, when a higher resistance is achieved, the difference in optical properties between the subregions (C) and the conductive regions (A) is increased. As a result, the conductive pattern is easily visually recognized. Thus, in order to maintain the high-resistance region at a high level and in order not to increase the difference in optical properties between the subregions (C) and the conductive regions, preferably, individual subregions (C) are completely isolated and narrowly spaced so as not to form a network that electrically connects the subregions (C) together, while a large total area of the subregions (C) is maintained.

In the case where the tolerance to the insulation of the high-resistance region is large, a structure in which in the high-resistance region, the subregions (D) not covered with the transparent conductive film are present and distributed in a portion covered with the transparent conductive film so as to be separated from each other can be used. A structure in which they are partially connected to each other can also be used. In this case, a smaller total area of the subregions (D) not covered with the transparent conductive film results in a smaller difference in optical properties between the subregions (D) and the conductive regions (A). However, the resistance is reduced. In the case where the total area is large and where the portion which separates the individual subregions (D) from each other and which is covered with the transparent conductive film is narrower, the resistance is increased. However, the difference in optical properties between the subregions (D) and the conductive regions (A) is increased.

With respect to the conductive regions, for example, in the case where a pattern of the uncovered subregions (D) is formed and where a region covered with the conductive film serves as the background, the size of the subregions (D) and the proportion of the area of the regions to be superimposed are adjusted. Thereby, the light transmittance of the regions is increased, or the haze value is reduced, without a significant reduction in conductivity. As a result, the optical properties when the regions are superimposed can be brought close to those of adjacent regions that are not superimposed.

As described above, for example, the type of high-resistance region can be selected from among: the high-resistance region including the subregions (C), the high-resistance region including the subregions (D), the high-resistance region including the subregions (C) and the subregions (D), depending on the resistance or insulation of the high-resistance region needed for the pattern of the transparent conductive layer, or the allowable level of the viewability of the transparent conductive pattern formed on the transparent substrate.

Furthermore, when the subregions (C) and/or the subregions (D) are used, the size, the distribution, the total area of the covered portions and uncovered portions, and so forth can appropriately determined, depending on properties ultimately needed for the substrate or film having a transparent conductive layer.

With respect to the period of the two-dimensional arrangement pattern which is formed in the high-resistance region (B) and which has a fine period or size that is not recognized by the naked eye, it is good if the pattern cannot be recognized by the naked eye. While the period varies slightly depending the optical properties of the transparent conductive layer to be formed, the period is preferably 250 µm or less, more preferably 150 µm or less, and still more preferably 100 µm or less. The size of the subregions (C) or subregions (D) is preferably 250 µm or less, more preferably 50 µm or less, and still more preferably 100 µm or less.

In the case of a substrate or film having a transparent conductive layer for a touch panel, the conductive regions (A) are electrode line formation portions (a), and the high-resistance region (B) is an electrode line-free portion (b). The two-dimensional arrangement pattern having a fine period or size that is not recognized by the naked eye is formed in a region (b1) of the electrode line-free portion (b), which is the high-resistance region (B), where the electrode line-free portions (b) are superimposed on each other. When the arrangement pattern has a period, any period may be used as long as the pattern cannot be recognized by the naked eye. While the period varies slightly depending the optical properties of the transparent conductive layer to be formed, the period is preferably 250 µm or less, more preferably 150 µm or less, and still more preferably 100 µm or less.

Even if the period of the two-dimensional arrangement pattern is not so small that it can be recognized, when the size of the subregions (C) or subregions (D) is sufficiently small, the arrangement pattern is not visually recognized. In this case, the size of each of the subregions is preferably 250 µm or less, more preferably 150 µm or less, and still more preferably 100 µm or less.

The two-dimensional arrangement pattern is preferably formed in the entire region (b1) and only the region (b1) of the electrode line-free portion (b) from the viewpoint of improving viewability.

As described above, by adjusting the period and the shape of the two-dimensional arrangement pattern having a fine period or size that is not recognized by the naked eye, the two-dimensional arrangement pattern being formed in the region (b1) where the electrode line-free portions (b) are superimposed on each other, the optical properties and the conductivity of the high-resistance region can be independently adjusted to some extent.

A substrate or film having a patterned transparent conductive layer, which is a substrate having a transparent conductive layer or a film having a transparent conductive layer of the present invention; the formation of the two-dimensional pattern having a fine period or size that is not recognized by the naked eye; a substrate or film having a patterned transparent conductive layer as an embodiment of a substrate or film having a transparent conductive layer of the present invention; and a transparent conductive layer pattern serving as electrode sensors in the X-axis and Y-axis directions of an X-Y touch panel, the transparent conductive layer pattern having a shape in which linear electrodes including diamond-shaped electrode portions linked at linking portions along a common axis are arranged in parallel, will be described in more detail below with reference to the attached drawings. The present invention is not limited to these embodiments.

FIG. 1 illustrates a schematic plan view of a substrate having transparent conductive layers for X electrodes or a substrate or film having patterned transparent conductive layers for X electrodes according to an embodiment of the present invention, and illustrates a partially enlarged view thereof.

Figure 2:
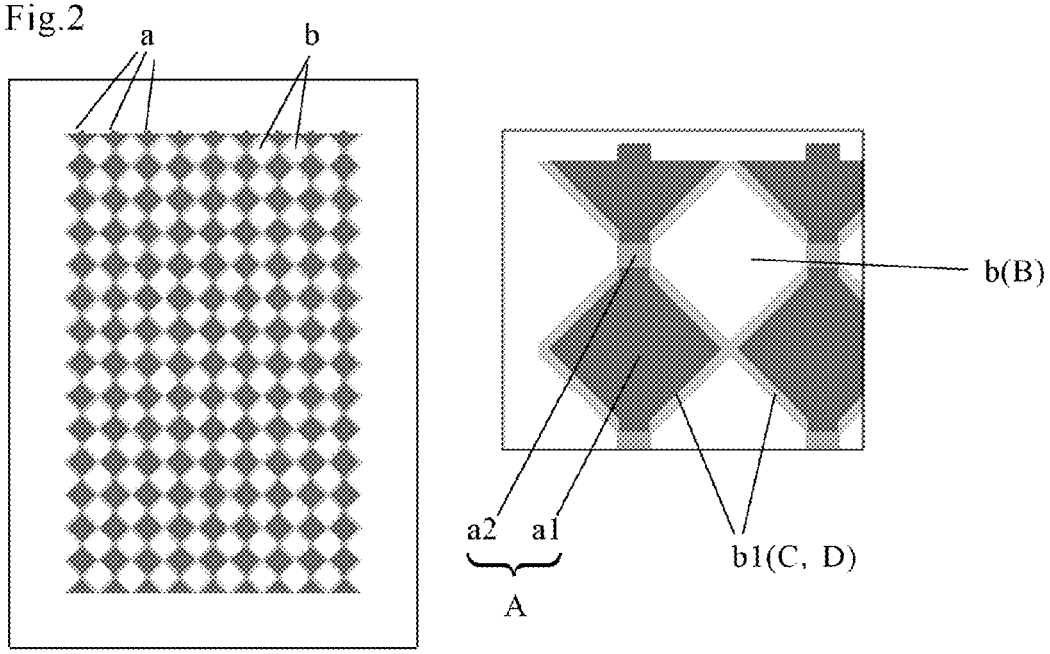
FIG. 2 is a schematic diagram of a substrate covered with a conductive pattern for Y electrodes, the substrate serving as a substrate having a transparent conductive layer of the present invention.

FIG. 2 illustrates a schematic plan view of a substrate having transparent conductive layers for Y electrodes or a substrate or film having patterned transparent conductive layers for Y electrodes according to an embodiment of the present invention, and illustrates a partially enlarged view thereof.

In this embodiment, in a touch panel in which two substrates having transparent conductive layers, i.e., the substrate or film having the patterned transparent conductive layers for the X electrodes and the substrate or film having the patterned transparent conductive layers for the Y electrodes, are bonded together, gap portions which do not contain an electrode and which are located between the X electrodes and the Y electrodes are provided. The gap portions are represented by gray portions around a diamond pattern in the enlarged views of FIGS. 1 and 2. A dummy pattern (insulating pattern) in the form of dots or a mesh with a period and/or size that is not easily recognized by the naked eye is arranged in the gap portions, the dummy pattern being formed of transparent conductive films having the same composition as the transparent conductive films configured to form the electrode portions, (see FIGS. 8 and 10). The gap portions preferably have a high resistance comparable to a resistance in the same positions before the formation of the dummy pattern. The gap portions preferably have a resistance not lower than the resistance in the same positions before the formation of the dummy pattern. If the resistance is reduced, a lower reduction in resistance is more preferred.

With respect to the haze value of the dummy pattern, in the dots or mesh formed of the transparent conductive films, optical properties of superimposed gap portions formed by bonding the substrate covered with a conductive pattern for the X electrodes and the substrate covered with a conductive pattern for the Y electrodes are preferably comparable to optical properties of the transparent conductive layers of the electrode portions that are not superimposed basically. In particular, in the case where a transparent conductive substance is a fibrous conductive substance, the pattern is easily visually recognized because of a difference in haze value. Thus, the gap portions are preferably formed in such a manner that the haze value of the superimposed gap portions is equal to the haze value of the electrode portions.

In a touch panel in which the substrate having the patterned transparent conductive layers for the X electrodes (the film having the patterned transparent conductive layers for the X electrodes) is bonded to the substrate having the patterned transparent conductive layers for the Y electrodes (the film having the patterned transparent conductive layers for the Y electrodes), bridges (linking portions) configured to connect diamond-shaped electrodes to each other to allow them to be conductive with each other are present at crossing portions where the X electrodes and the Y electrodes cross (enlarged views of FIGS. 1 and 2). Transparent conductive layers having uncovered dot-like portions that are not easily recognized by the naked eye are preferably arranged on the bridges (see FIG. 13).

The transparent conductive layers at the crossing portions are preferably formed in such a manner that when the substrate having the patterned transparent conductive layers for the X electrodes (the film having the patterned transparent conductive layers for the X electrodes) and the substrate having the patterned transparent conductive layers for the Y electrodes (the film having the patterned transparent conductive layers for the Y electrodes) are bonded together to superimpose the transparent conductive layers, the haze value of the superimposed transparent conductive layers is equal to that of the transparent conductive layers at the X and Y electrode portions that are not superimposed on each other.

Figure 3:
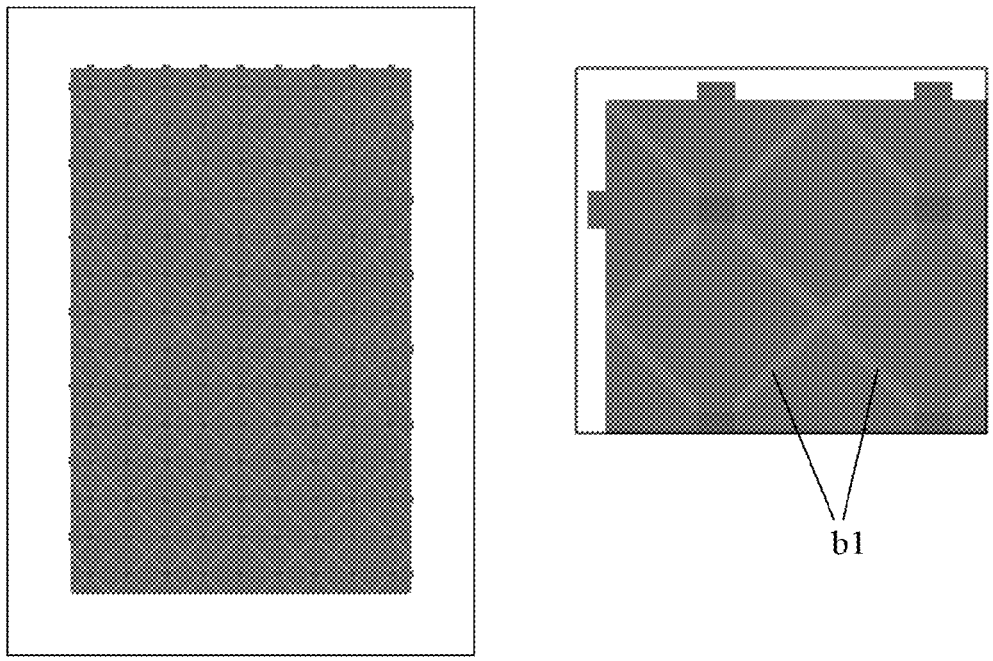
FIG. 3 is a schematic diagram in which the substrates covered with conductive patterns for X and Y electrodes are superimposed, each of the substrates serving as a substrate having a transparent conductive layer of the present invention.

FIG. 3 illustrates a front view and a cross-sectional view when the substrate having the patterned transparent conductive layers for the X electrodes (the film having the patterned transparent conductive layers for the X electrodes) serving as the substrate having the transparent conductive layers illustrated in FIG. 1 is superimposed on the substrate having the patterned transparent conductive layers for the Y electrodes (the film having the patterned transparent conductive layers for the Y electrodes) serving as the substrate having the transparent conductive layers illustrated in FIG. 2. Dummy pattern portions of the X electrodes and dummy pattern portions of the Y electrodes are superimposed to fill gap portions between the X electrodes and the Y electrodes.

The crossing portions of the X electrodes and the Y electrodes correspond to the bridges (linking portions) of the X electrodes and the Y electrodes and are formed by orthogonally superimposing the substrate (film) having the patterned transparent conductive layers for the X electrodes on the substrate (film) having the patterned transparent conductive layers for the Y electrodes with an optically clear adhesive (OCA) serving as an insulating layer.

Figure 4:
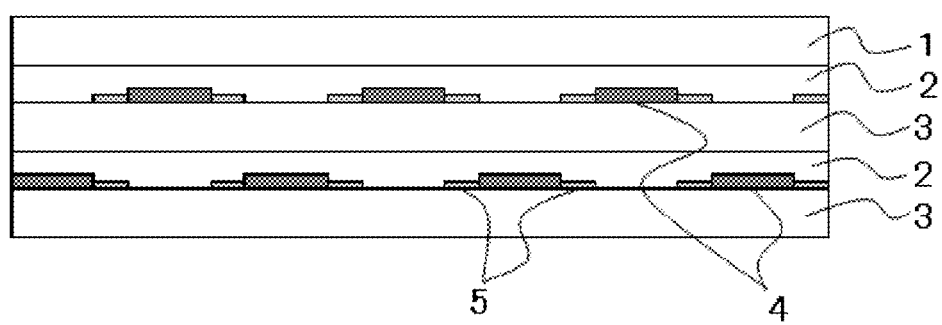
FIG. 4 is a cross-sectional view of a touch panel sensor portion in which substrates covered with conductive patterns for X and Y electrodes are superimposed, each of the substrates serving as a substrate having a transparent conductive layer of the present invention.

FIG. 4 is an exemplary cross-sectional view of a laminate illustrated in FIG. 3, the laminate including the stacked substrates (films) having the transparent conductive layers, i.e., the laminate including the substrate (film) having the patterned transparent conductive layers for the X electrodes and the substrate (film) having the patterned transparent conductive layers for the Y electrodes, according to an embodiment of the present invention.

The substrate (film) having the patterned transparent conductive layers for the Y electrodes, the substrate including the transparent conductive films 4 at the electrode portions, the insulating dummy pattern 5 at the gap portions, and the bridges, is stacked on the substrate (film) having the patterned transparent conductive layers for the X electrodes, the substrate similarly including transparent conductive films 4 at the electrode portions, insulating dummy pattern 5 at the gap portions, and the bridges provided on a transparent film substrate 1, with an optically clear adhesive (OCA) 2. A screen panel configured to protect a touch panel sensor is further stacked on the substrate (film) having the patterned transparent conductive layers for the Y electrodes with the optically clear adhesive (OCA) 2, thereby resulting in an X-Y type touch panel sensor.

The insulating dummy pattern and conductive dummy pattern of the substrate (film) having the patterned transparent conductive layers will be described in detail below.

Figure 5:
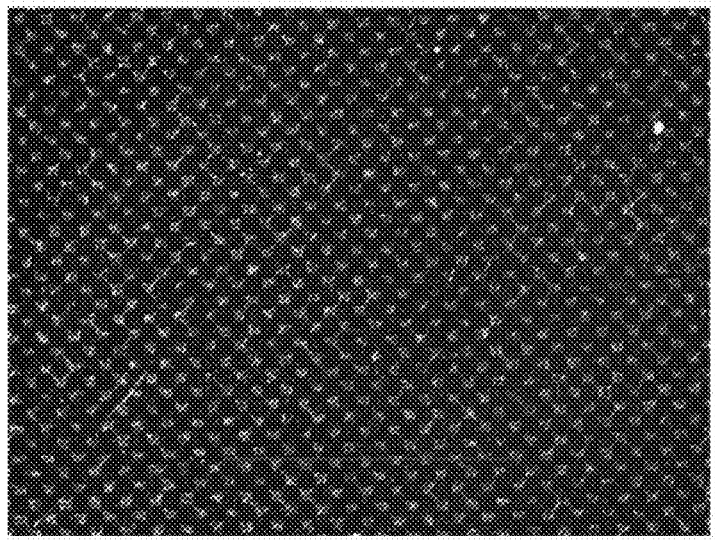
FIG. 5 is a micrograph of a discontinuous transparent conductive film used for a dummy pattern for gaps illustrated in FIG. 4 of the present invention.
Figure 6:
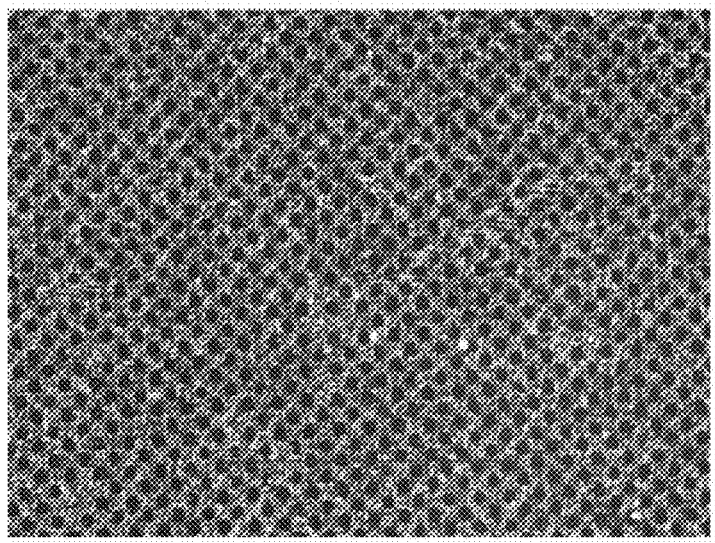
FIG. 6 is a micrograph of a conductive transparent conductive film used for bridges corresponding to portions where both electrodes cross illustrated in FIG. 5 of the present invention.

With respect to the insulating dummy pattern, for example, a dot-like conductive film pattern in which minute isolated conductive layer regions are arranged so as not to be conductive with each other with a distance kept between the conductive layer regions as illustrated in FIG. 5 may be used as a preferred insulating dummy pattern. With respect to the conductive pattern, a mesh-like conductive film pattern in which uncovered dot-like portions are provided in conductive films may be preferably used, as illustrated in FIG. 6.

The insulating dummy pattern used in the present invention will be described in more detail, the insulating dummy pattern being provided in positions corresponding to gaps where the X electrodes and the Y electrodes are not present.

As described above, the dummy pattern may be produced as a non-conductive dummy pattern formed of, for example, transparent conductive films configured to form the electrodes, the dummy pattern being in the form of dots or a mesh with a size that is not easily recognized by the naked eye. Preferably, a short circuit does not occur between electrode lines including series of diamond-shaped electrode portions that are aligned and linked along a common axis of the substrate (film) having the patterned transparent conductive layers for each electrode. Furthermore, in the case where the substrates (films) having the patterned transparent conductive layers for the X electrodes and the Y electrodes are superimposed, the haze value of the dummy patterns in a superimposed state is preferably equal to the haze value of the electrode portions.

The form of the dots that form the dummy pattern is not particularly limited as long as the foregoing object is achieved. An example of the simplest form of the dots that may be used is the form of dots as illustrated in FIG. 5. The dot pitch is preferably 250 µm or less, more preferably 150 µm or less, still more preferably 100 µm or less, yet more preferably 80 µm or less, and yet even more preferably 60 µm or less.

The dots of the dummy patterns used for the substrates covered with the conductive patterns for the X and Y electrodes may have a uniform size or different sizes and may be appropriately selected in such a manner that the X and Y electrodes are not easily visually recognized when the X and Y electrodes are superimposed.

In this embodiment, in the touch panel in which the substrates (films) having the patterned transparent conductive layers for the X and Y electrodes, the substrates serving as the substrates having the transparent conductive layers, are bonded together, the bridge portions, which are crossing portions where the X electrodes and the Y electrodes cross, will be described in more detail below.

As described above, as illustrated in FIG. 6, for example, the mesh-like conductive dummy pattern in which uncovered dot-like portions are arranged may be used for transparent conductive films at the bridge portions, the mesh-like conductive dummy pattern having a size that is not easily recognized by the naked eye while the conductivity is ensured in such a manner that the diamond-shaped electrodes are conductive with each other. This results in a reduction in the haze value of the linking portions (bridges) corresponding to the crossing portions and the elimination of the occurrence of a high haze value at the crossing portions of the conductive patterns for the electrodes. Hence, the crossing portions are not visually recognized on a display, for example.

The transparent conductive films at the crossing portions are preferably formed so as to have a haze value equal to the haze value of the electrode portions of the X electrodes and the Y electrodes when the substrate (film) having the patterned transparent conductive layers for the X electrodes is bonded to the substrate (film) having the patterned transparent conductive layers for the Y electrodes.

For example, the form of the uncovered dot-like portions provided at the bridge portions is not particularly limited as long as the foregoing object is achieved. An example of the simplest form of the dots that may be used is the form of dots as illustrated in the schematic enlarged view of FIG. 6. The dot pitch is preferably 250 µm, more preferably 150 µm or less, still more preferably 100µ or less, yet more preferably 80 µm or less, and yet even more preferably 60 µm or less. The size of the dots may be appropriately selected in view of the conduction resistance and the haze value. The size of the dots is preferably 250 µm, more preferably 150 µm or less, still more preferably 100µ or less, yet more preferably 80 µm or less, and yet even more preferably 60 µm or less.

The haze value of the transparent conductive films at the crossing portions when the substrates (films) having the patterned transparent conductive layers for the X and Y electrodes are stacked is in the range of 50% to 150% and preferably 80% to 120% of the haze value of the electrode portions in each of the X direction and the Y direction. The haze value at the crossing portions before stacking is determined as a value obtained by multiplying a haze value of portions of the transparent conductive films that are not superimposed in each of the X direction and the Y direction by the occupied area ratio of the transparent conductive films at the linking (bridge) portions. The total area of the uncovered dot-like portions (subregions D) formed at the crossing portions can be determined in such a manner that a necessary conduction resistance is achieved and that the haze value within the above range is achieved.

Accordingly, in the substrates (films) having the patterned transparent conductive layers according to this embodiment, there are only slight differences in hue, light transmittance, and haze value among the interelectrode gap portions, the crossing portions of the electrodes, and the electrode portions. The patterns for both electrodes are not easily visually recognized when arranged on a display, for example. In particular, in the case where a conductive substance is formed of conductive fibers, such as conductive microfibers, and has a haze value due to light scattering by the conductive fibers, the reduction in the difference in haze value results in the effect of significantly improving the viewability.

The substrate having the transparent conductive layers, or the substrate or film having the transparent conductive layers may be formed through a step of applying or printing a coating material for a transparent conductive layer or an ink for a transparent conductive layer, the coating material or ink composed of a dispersion containing a transparent conductive substance dispersed in a dispersion medium, onto a transparent substrate or transparent film substrate.

The substrates or films having the patterned transparent conductive layers for the X electrodes and the Y electrodes may also be formed through the application step or printing step. At this time, two-dimensional arrangement patterns, which are formed at electrode line-free portions, of the transparent conductive layers each having a fine pitch or size that is not recognized by the naked eye are produced as patterns formed by the use of the dots or mesh of a printing plate or the like. Thus, the two-dimensional pattern having the very fine pitch or size may be easily formed through the application or printing process simultaneously with the formation of the entire patterned transparent conductive layer.

That is, in usual image formation by an application process or a printing process, the density and the color tone of an image are adjusted by a pixel group what is called dots having a fine size or a two-dimensional period that is not recognized by the naked eye. Depending on the amount of a coating material or an ink charged into the dots, the dots may be formed into a uniform film that is recognized as a high-density image when the dots are connected to each other and then visually recognized. Alternatively, the dots may also be isolated from each other to form a region between the dots, the region being not covered with the ink. Thus, an electrode line pattern and the two-dimensional arrangement pattern which is formed at the electrode line-free portions and which has a very fine period and/or size that is not recognized by the naked eye may be simultaneously formed on a transparent substrate by the application of a coating material for a transparent conductive layer or the printing of the ink for a transparent conductive layer with a single plate.

The two-dimensional arrangement pattern of the transparent conductive layers, formed in the present invention, each having a fine period that is not recognized by the naked eye has an optically uniform appearance. By adjusting the ratio of a region where each of the transparent conductive layers is formed to a region where the transparent conductive layer is not formed and by adjusting the shapes of the regions, the conductivity and the optical properties of the regions where the two-dimensional pattern is formed may be adjusted. With respect to the ratio of the region where each transparent conductive layer is formed to the region where the transparent conductive layer is not formed and the shapes of the regions in the portions where the two-dimensional arrangement pattern that is not recognized by the naked eye is formed, for example, in the case where the optical properties are adjusted while the conductivity of the portions including the two-dimensional arrangement pattern is maintained, the transparent conductive layers are formed in such a manner that mesh-like transparent conductive layers are formed in regions for the transparent conductive layers. That is, the opening ratio of the mesh may be adjusted by adjusting the shape, size, and so forth of the dots of the printing plate or the like.

However, in the case where the conductive substance is a fibrous conductive substance, the conductive substance intertwines to form network-like conduction paths. Thus, when the width of the mesh opening of the conductive layer is reduced, the conduction paths due to the entanglement of the fibrous conductive substance are not easily formed, thereby easily reducing the conductivity.

In the case where the optical properties are adjusted while the high resistance and insulation are maintained, the transparent conductive layers are formed in such a manner that the region where each transparent conductive layer is not formed has a mesh-like shape and that the region where the transparent conductive layer is formed has an island shape or a dot-like shape. That is, the size of the islands or dots may be adjusted by adjusting the shape, size, and so forth of the dots of the printing plate or the like.

In the case where the transparent conductive pattern is formed with a fibrous conductive substance serving as a conductive substance, the fibrous conductive substance in the transparent conductive layer is in contact with adjacent fibrous conductive substance to form a network, thereby maintaining the conductivity of the entire conductive region. Thus, even if the contact of the fibrous conductive substance is just partially broken, the conductivity of the entire region is reduced to increase the resistance. For example, in the case where subregions (D) that are not covered with the transparent conductive film are formed in the transparent conductive region and where the density of the subregions (D) is gradually increased to adjust the resistance of the region, the conductivity of the region is often lost at an early stage of adjustment.

[Material Constituting Substrate Having Transparent Conductive Layer]

Structures of components of the substrate (film) having the transparent conductive layers specified in the present invention and raw materials that may be used for a coating material for a transparent conductive layer, the coating material being used to produce the transparent conductive layers of the substrate (film) having the transparent conductive layers, will be described below. A method for producing the substrate (film) having the transparent conductive layers according to the present invention with the raw materials will also be described.

Typical examples of a transparent substrate on which the transparent conductive layers are formed and which may be used in the present invention include plate-like substrates composed of glass and so forth; sheet-like substrates composed of, for example, polyesters, such as polyethylene terephthalate and polyethylene naphthalate, polyolefins, such as polyethylene, polypropylene, polystyrene, and EVA, vinyl resins, such as polyvinyl chloride and polyvinylidene chloride, and plastics, such as polysulfone, poly(ether sulfone), polycarbonate, polyamide, polyimide, and acrylic resins; and films composed of the same plastics. In particular, plate-like substrates, sheet-like substrates, and film-like substrates having a total visible-light transmittance of 70% or more are preferred. They may be colored to the extent that the object of the present invention is not impaired. The substrate may be used in the form of a single layer. Alternatively, the substrate may be used in the form of, for example, a multilayered film in which two or more layers are combined. At least one surface of the substrate may be subjected to treatment to impart easy-peeling properties. Among these plate-like substrates, sheet-like substrates, and films, plastic films are light in weight, easy to process, and easy to handle. Among these plastic films, polyethylene terephthalate films and polyethylene naphthalate films are preferred in view of transparency, heat resistance, handleability, and cost. Polyethylene terephthalate films are most suitable. The transparent plastic substrate preferably has a thickness of 5 μm to 300 μm, more preferably 10 μm to 250 μm, and still more preferably 25 μm to 200 μm because an excessively small thickness leads to poor handleability and because an excessively large thickness leads to a reduction in the transmittance of visible light.

In the present invention, a patterned transparent conductive region formed on the transparent substrate contains a binder resin and a conductive substance.

With respect to the shape of the transparent conductive substance, various shapes, such as particle, fibrous, and thin-film shapes may be used.

As the substance having the particle shapes, fine particles of conductive inorganic substances, such as tin oxide, cadmium oxide, antimony-doped tin oxide (ATO), fluorine-doped tin oxide (FTO), tin-doped indium oxide (ITO), and aluminum-doped zinc oxide (AZO), formed by known methods are used. Among these substances, ITO is preferred from the viewpoint of achieving better conductivity. A substance in which a transparent conductive substance is coated on a surface of a fine substance serving as a core material may also be used. An example of the material that may be used is an inorganic material, e.g., ATO or ITO, coated on surfaces of transparent fine particles composed of, for example, barium sulfate. As the core material, organic conductive fine particles may be used. In this case, examples thereof include metal materials coated on surfaces of fine resin particles. Typically, the fine particles preferably have a particle size of 10 μm or less, more preferably 1.0 μm or less, and still more preferably 50 nm to 150 nm.

As the fine conductive substance used in the present invention, a fibrous substance is preferred. In particular, a wire-shaped substance having the following properties is preferred: it is not branched, is easily disentangled, easily provides a fibrous substance having a uniform distribution density, and thus forms large openings in the interconnections among fibers to achieve satisfactory light transmittance. Examples of the conductive substance having the shape include carbon nanotubes; and metal nanowires, which are wire-like conductive metals. In the present invention, metal nanowires refer to a nanosized fine conductive substance which has a linear or curved thin rod shape and which is composed of a metal. In the case where a fine conductive substance has a fibrous shape and preferably a wire-like shape, they are entangled with each other to form a network. Thus, even if a small amount of the conductive substance is used, satisfactory electrical conduction paths can be formed to further reduce the resistance of the conductive layers, which is preferred. In the case where the network is formed, even if the fibrous conductive substance is not transparent, the satisfactory transparency of the resulting coating film can be achieved because of large openings of the network.

Specific examples of a metal for the metal nanowires include iron, cobalt, nickel, copper, zinc, ruthenium, rhodium, palladium, silver, cadmium, osmium, iridium, platinum, and gold. Copper, silver, platinum, and gold are preferred in view of conductivity. Platinum-plated or gold-plated silver is more preferred. At least one cross-sectional dimension of each of the metal nanowires is preferably less than 500 nm, more preferably less than 200 nm, and still more preferably less than 100 nm. Each of the metal nanowires preferably has an aspect ratio of more than 10, more preferably more than 50, and still more preferably more than 100. The shape and size of each metal nanowire may be determined with a scanning electron microscope or transmission electron microscope.

The metal nanowires may be prepared by a method known in the technical field. Examples of the known method include a method in which silver nitrate is reduced in a solution; and a method for continuously forming metal nanowires by applying a voltage or current from the tip of a probe to a surface of a precursor to draw metal nanowires at the tip of the probe (Japanese Unexamined Patent Application Publication No. 2004-223693). With respect to the method in which silver nitrate is reduced in a solution, more specifically, silver nanowires may be synthesized by the liquid-phase reduction of a silver salt, such as silver nitrate, in the presence of polyol, such as ethylene glycol, and polyvinylpyrrolidone. While the mass production of uniform-sized silver nanowires may be performed by, for example, methods described in Xia Y. et al., Chem. Mater. (2002), 14, 4736-4745 and Xia Y. et al., Nano letters (2003), 3(7), 955-960, the method is not particularly limited to the methods described therein.

The conductive metal nanowires can be entangled with each other with an appropriate distance kept between the nanowires to form conduction paths on a transparent substrate, thereby resulting in substantially transparent conduction paths. Specifically, the type of metal, the axial length, the aspect ratio, and so forth may be appropriately determined, depending on the intended use.

The substrate having the transparent conductive layers of the present invention is produced by forming transparent conductive layers on a transparent substrate with a dispersion containing the fine conductive substance dispersed therein. As a liquid serving as a dispersion medium used to form a transparent conductive coating material, which is the dispersion containing the conductive substance, various known dispersion media may be used without particular limitation. Examples thereof include saturated hydrocarbons, such as hexane; aromatic hydrocarbons, such as toluene and xylene; alcohols, such as methanol, ethanol, propanol, and butanol; ketones, such as acetone, methyl ethyl ketone (MEK), methyl isobutyl ketone, and diisobutyl ketone; esters, such as ethyl acetate and butyl acetate; ethers, such as tetrahydrofuran, dioxane, and diethyl ether; amides, such as N,N-dimethylformamide, N-methylpyrrolidone (NMP), and N,N-dimethylacetamide; and halogenated hydrocarbons, such as ethylene chloride and chlorobenzene. A dispersant may be used, depending on the type of dispersion medium. Among these compounds, dispersion media having polarity are preferred. In particular, hydrophilic media, such as alcohols, e.g., methanol and ethanol, and amides, e.g., NMP, are preferred because satisfactory dispersibility is provided even without a dispersant. These liquids may be used separately or in combination as a mixture of two or more.

As a dispersion medium, water may be used. In the case where water is used, when a transparent substrate has a hydrophobic surface, the substrate easily repels water. Thus, when the transparent conductive coating material is applied, a uniform film is not easily formed. In this case, a uniform film is formed by mixing an alcohol with water or by selecting a surfactant that improves the wettability of the hydrophobic transparent substrate and adding the surfactant to the water.

The amount of the liquid serving as a dispersion medium used is not particularly limited and may be adjusted in such a manner that the dispersion containing the fine conductive substance has a viscosity suitable for application or printing. For example, the amount of the liquid may be set in a wide range of 100 to 100,000 parts by weight with respect to 100 parts by weight of the transparent conductive substance. The amount of the liquid may be appropriately selected, depending on the types of the transparent conductive substance and the dispersion medium, a stirrer, and a dispersing device.

The dispersion of the conductive substance in the dispersion medium may be performed by employing a known dispersion method with a mixture of the conductive substance and the liquid serving as a dispersion medium, as needed. However, in order to form transparent conductive layers having satisfactory transparency and conductivity, it is important that the properties of the fine conductive substance be not significantly changed before and after dispersion treatment and that the transparency of the mixture be not lost. In particular, in the case where the conductive substance is metal nanowires, breaking causes reductions in conductivity and transparency. Thus, it is important to select a dispersion method by which the shape of the metal nanowires is not broken.

The coating material for a transparent conductive layer or the ink for a transparent conductive layer may contain a binder resin.

The binder resin that is contained in the transparent conductive layers has a function to fix the conductive substance in the transparent conductive layers to the substrate with the conductive layer. With respect to a resin having the function as the binder resin, only a resin used at the time of the formation of the transparent conductive layer on the transparent substrate does not necessarily function as the binder resin. Various resins used in steps before a step of ultimately forming the patterned transparent conductive layers also have the function together with the transparent conductive substance. Alternatively, various resins which are used for the conductive substance in the transparent conductive layers that have been formed on the substrate and which are used in the subsequent steps have the function.

In the production of the transparent conductive layers containing the binder resin and the transparent conductive substance on the transparent substrate, as the binder resin used in one or both of a step of forming the transparent conductive layers on the substrate and a step of fixing the transparent conductive layers on the substrate, the following materials may be used.

Materials or combinations of materials usable as the binder resin to form the transparent conductive layers or to fix the transparent conductive layers will be described below. The formation or fixation of a coating film with the binder resin is performed by the polymerization of a monomer or an oligomer (10 to 100 monomers) contained in a coating material for a protective layer by photoirradiation or heating, or by the cross-linking of a resin in the coating material for the protective layer by drying and heating, to form a solid polymer matrix. Alternatively, the formation or fixation is performed by the formation of a cross-linked coating film of the binder resin in the solvent by removing the solvent. The coating film is not necessarily a film formed by curing through the polymerization or cross-linking process. However, the fixation is preferably performed through the polymerization of a monomer by, for example, visible light, ultraviolet rays, an electron beam, or heating, or through the cross-linking of a polymer with a cross-linking agent in view of the durability and scratch resistance of the coating film.

An organic polymer used as a binder preferably contains a polar functional group bonded to a carbon skeleton. Examples of the polar functional group include a carboxyl group, an ester group, a ketone group, a nitrile group, an amino group, a phosphate group, a sulfonyl group, a sulfonate group, a poly(alkylene glycol) group, and an alcoholic hydroxy group. Examples of the polymer useful as a binder include acrylic resins, alkyd resins, polyurethane, acrylic urethane, polycarbonate, polyester, polystyrene, polyacetal, polyamide, polyvinyl alcohol, polyvinyl acetate, and cellulose. Examples of an inorganic polymer include siloxane polymers formed by the hydrolysis and condensation of tetraalkoxysilanes.

Examples of a polymerizable organic monomer serving as a monomer or an oligomer include acrylate- and methacrylate-type monomers and oligomers, such as methyl acrylate, methyl methacrylate, methoxypolyethylene glycol methacrylate, glycidyl acrylate, ethylene oxide-modified phosphoric acid acrylate, urethane acrylate, polyethylene glycol methacrylate, polybutadiene acrylate, and polyester acrylate; other vinyl monomers, such as mono(2-methacroyloxyethyl) acid phosphate, acrylic acid, methacrylic acid, itaconic acid, acrylonitrile, methacrylonitrile, styrene, and vinyltoluene; and epoxide compounds, such as bisphenol A diglycidyl ether.

Examples of a polymerizable inorganic monomer serving as a monomer include mineral acid salts, organic acid salts, alkoxides, and complexes (chelates) of metals, such as Si, Ti, Zr, Al, Sn, Fe, Co, Ni, Cu, Zn, Pb, Ag, In, Sb, Pt, and Au. They are polymerized by hydrolysis or thermal decomposition and are ultimately formed into inorganic compounds (e.g., metal oxides, hydroxides, carbides, and metals). Thus, they are treated as inorganic monomers in the present invention. These inorganic monomers may also be used in the form of a partial hydrolysate thereof. While specific examples of a metal compound will be illustrated below, the metallic compound is not limited thereto.

[Method for Producing Substrate and Film Having Transparent Conductive Layer]

A method of the present invention for producing the substrate and film having the transparent conductive layers with the raw materials described above will be described below.

In the present invention, a transparent conductive layer pattern is formed on a transparent substrate with the transparent conductive films containing the binder resin and the conductive substance. The pattern includes the conductive regions (A) and the high-resistance region (B). The high-resistance region (B) includes the subregions (C) that are covered with the transparent conductive films and the subregions (D) that are not covered with the transparent conductive films, the subregions (C) and/or the subregions (D) being located in the high-resistance region (B). The subregions (C) and/or the subregions (D) are isolated subregions that form a two-dimensional arrangement pattern having a fine period and/or size that is not recognized by the naked eye. Alternatively, the subregions (C) and/or the subregions (D) are subregions where the foregoing subregions are partially connected to each other. The pattern may be formed by printing with a conductive ink containing the binder resin and the conductive substance.

Methods for forming the two-dimensional pattern of the transparent conductive layers having a fine period or size that is not recognized by the naked eye, the two-dimensional pattern being used for the substrate or film having the patterned transparent conductive layers, are broadly divided into the following two methods by application or printing:

(1) a method in which a coating material for a transparent conductive layer or an ink for a transparent conductive layer is directly applied or printed on the transparent substrate or a transparent film substrate by a known application technique or printing technique to form the pattern;

(2) a method in which the transparent conductive layers are formed on the entire surface of the transparent substrate or a transparent substrate film by a known application technique or printing technique and then are processed by an etching technique, a laser scribing technique, a lift-off method, or the like to form the pattern.

In the method (1) in which the transparent conductive layer pattern is directly formed, when the coating material for a transparent conductive layer or the ink for a transparent conductive layer is applied or printed on the substrate or film, the thickness at the time of the application or printing and the pattern at the time of the application or printing are adjusted by the design of a plate and the design of mix of the coating material or ink. Usually, the coating material or ink is applied or printed by, for example, a screen, gravure, or inkjet method to form the pattern.

However, in the case where a transparent conductive film composed of conductive microfibers, such as silver nanowires, is formed, in order to ensure transparency and conductivity, a small amount of the conductive microfibers needs to be uniformly applied with high accuracy, and then the fibers need to cross each other to make electrical contact with each other thereat. Thus, a coating liquid to form the transparent conductive layers needs to have a low conductive microfiber content and minimize the binder resin that inhibits electrical contact. Meanwhile, in the case where the pattern of the transparent conductive layers is formed by printing, it is important to control the viscoelasticity of an ink to impart printability to the ink. With respect to the ink or coating liquid containing the conductive microfibers, it is difficult to achieve rheology required because of significant restrictions on composition. Thus, it is very difficult to form the film having the transparent conductive layers with the fine pattern of the present invention in one printing operation, the fine pattern being formed of transparent conductive films serving as electrodes with a uniform thickness.

In the method (2), it is necessary to use, for example, a resist solution for etching, an etching solution, a stripping agent, or an adhesive that satisfies basic properties for etching or lift-off. The coating material for a transparent conductive layer is not limited as long as uniform transparent conductive layers are formed. The coating material for a transparent conductive layer and the ink for a transparent conductive layer have only a few restrictions on the composition design. In this case, the etching method is not necessarily preferred in terms of environmental impacts because of the formation of a waste developer and a waste etching solution in the etching method.

In laser scribing, a special laser beam machine is required. In addition, patterning requires time, so laser scribing is costly. In a method in which stripping agent and adhesive patterns are formed by printing and transfer and lift-off are performed, microprinting on the order of 10 μm can be performed owing to advances in printing technique. In a patterning step of transferring a portion used or removing an unnecessary portion, a dry process can be selected. This method is most preferred as a patterning method used in the present invention from the viewpoint that the conductive film pattern can be formed only through an application or printing step.

[Method for Directly Forming Pattern by Applying or Printing Coating Material or Ink for Transparent Conductive Layer]

A method for forming a transparent conductive film pattern by direct application or printing on a transparent substrate or film will be described below.

Here, the pattern includes the conductive regions (A) uniformly covered with the transparent conductive layers and the high-resistance region (B) including the subregions (C) and/or the subregions (D). The subregions (C) and/or the subregions (D) are isolated subregions that form a two-dimensional arrangement pattern having a fine period or size that is not recognized by the naked eye. Alternatively, the subregions (C) and/or the subregions (D) are subregions where the foregoing subregions are partially connected to each other. In the present invention, with respect to the application method or printing method, the pattern may be formed by printing the ink for a transparent conductive layer on the transparent substrate using a single printing plate having a portion configured to perform printing for the regions (A) and a portion configured to perform printing for a region including the subregions (C) and the subregions (D) in the region (B).

Printing methods that may be employed include printing methods, such as lithography, letterpress, gravure, and screen printings, using printing plates. A printing method employed may be selected, depending on properties of a conductive ink used. Among these printing methods, a gravure printing method is preferred because the two-dimensional pattern formed of the dots can be adjusted more precisely by adjusting not only the size and density but also the depth of dots.

In the case where the transparent conductive pattern of the present invention is formed on the transparent substrate by, for example, gravure printing with the plate, the transparent conductive pattern may be formed on the transparent substrate with the coating material for a transparent conductive layer by gravure printing using a single gravure cylinder including a gravure cell pattern which corresponds to the regions (A) and which is configured to perform solid printing and a gravure cell pattern which corresponds to the subregions (C) and the subregions (D) in the region (B) and which is configured to print regions corresponding to the isolated subregions that form a two-dimensional arrangement pattern having a fine period or size that is not recognized by the naked eye or corresponding to subregions where the foregoing subregions are partially connected to each other.

A method for forming the insulating dummy pattern and the conductive dummy pattern on the transparent substrate or the transparent film substrate by the printing method of the present invention will be described in more detail.

With respect to the printing method, as a simpler method for forming a dot-like pattern and a mesh-like pattern and for determining a dot shape of the present invention, a halftone technique used when a gray-scale or color image is formed by printing in a limited number of colors may be employed. The halftone technique is a technique in which, for example, a dot-like pattern of printed dots with black ink is provided on white paper, the dots varying in size or in dot density. When the dot-like pattern is viewed from an adequate distance, the dot shape is not identified by the human eye because of the printed dots are very small. The dot-like pattern is recognized as if it were gray. Thus, continuous lightness expression from black to white can be made on the basis of the area ratio of the black dots to a white background.

Similarly, in the case where the coating material or ink for a transparent conductive layer is printed by the halftone technique, binary states, i.e., "presence" or "absence" of the conductive film, are controlled. However, the control of the area ratios of the dots enables the formation of a transparent conductive region or high-resistance region having a desired uniform haze value.

The electrical properties and the optical properties of the conductive regions and the high-resistance regions in the substrate having the transparent conductive layers and the film having the transparent conductive layers of the present invention may be adjusted more precisely by various printing techniques described below.

Figure 7:
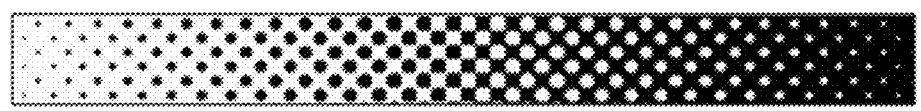
FIG. 7 is a schematic enlarged view of a density-gradient dummy pattern used for gaps between electrodes of a substrate covered with a conductive pattern for X electrodes when the substrates covered with conductive patterns for X and Y electrodes are superimposed, the substrate serving as a substrate having a transparent conductive layer of the present invention.

In the case of using "amplitude modulation (AM) screening", which is the most common halftone technique and the gradation is expressed by the size of halftone dots, the foregoing properties are adjusted by adjusting the distance and connection between halftone dots to adjust the formation of the subregions (C) as illustrated in FIG. 7. The following is utilized: That is, in a portion extending from highlights where printed dots are small to around intermediate-density, the printed halftone dots are separated from each other. In a portion extending from around the intermediate density to a solid region, printed dots are large and connected to each other. The area of a region covered with the connected halftone dots is substantially continuously changed. In this portion, unprinted regions are left in the form of dots. The area of the unprinted regions is gradually reduced.

The electrical properties, such as electrical conductivity, of the transparent conductive layers are significantly affected mainly by whether the halftone dots serving as the subregions (C), are connected to each other or not. The optical properties, such as haze, are significantly affected by the total area of the halftone dots serving as the subregions (C). The desired total area of the halftone dots and the separated state and the connected state of the dots may be independently adjusted by changing the shape of the dots to some extent. Specifically, in the case where round dots are used, the connection between the dots occurs at a density higher than the intermediate density. In other words, the connection between the dots occurs in a region where the area ratio of the dots exceeds 50%.

Figure 8:
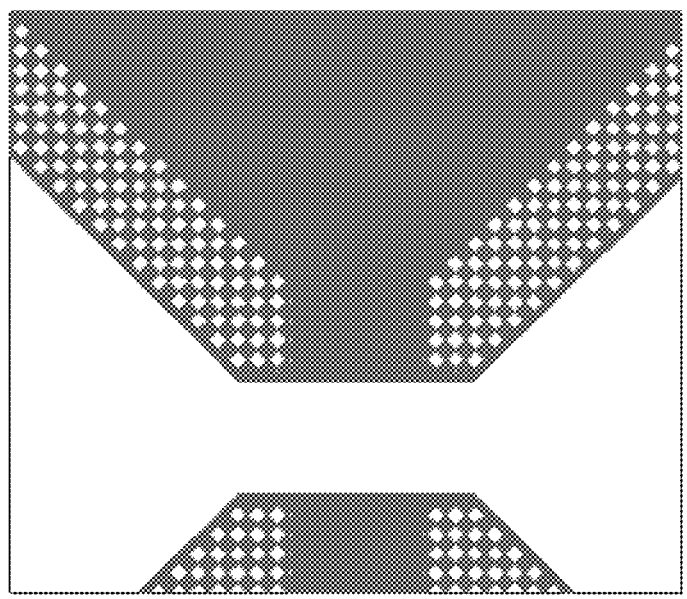
FIG. 8 is a schematic enlarged view of a checkered negative pattern for a heat-sensitive adhesive, the negative pattern being used to form an insulating dummy pattern having an area of about 50%.

When the shape and the arrangement of the dots like a checkered pattern illustrated in FIG. 8 are used, the connection between the dots occurs in a region having a density lower than the intermediate density. In other words, the connection between the dots occurs in a region where the area ratio of the dots is lower than 50%. In this way, by adjusting the shape of the dots, the adjustable ranges of the electrical properties and the optical properties can be further increased.

Sufficiently high screen ruling of a printing plate enables the pattern of the halftone dots separated or connected to have a size that is not easily recognized by the naked eye.

Usually, with respect to the separation and connection between the dot-like transparent conductive films formed by halftone printing, the use of round-shaped dots enables the formation of the subregions (C) that are separated from one another and are insulative until high print density. When rectangular dots are used, a conductive printed pattern in which the dot-like transparent films serving as the subregions (C) are connected to each other can be formed at low density, compared with the round-shaped dots.

By using these printing techniques, with respect to the optical properties of the regions, such as the transparent conductive regions and high-resistance regions, having the conductive films on the substrates (films) having the transparent conductive layers for the X electrode portions and the Y electrode portions, an approximately intermediate value between the electrode line formation portions (a) and the electrode line-free portions (b) can be achieved. With respect to the electrical properties, such as the conduction and insulation of the transparent conductive films, the value can be adjusted to a value close to values of the transparent conductive regions and the high-resistance regions.

A technique for controlling the electrical properties, such as conductivity and insulation, while specific optical properties, such as the haze value, are maintained is not limited to the techniques described above. Examples of a halftone technique that may be appropriately employed include an FM screening dot method in which variable-period control is performed on halftone dots; and Fairdot 2 (trade name, Media Technology Japan Co., Ltd.) in which an AM screen dot method that controls the size of dots and the FM screen dot method are combined together.

In recent years, there have been advances in digital plate-making technology using laser. In this system, microcells having any size can be spaced at freely-selected intervals, and printing cells can be formed in any grid-like shape, independently of screen ruling, which expresses the resolution of printing. This is particularly effective method used in the formation of a printing plate required to control the electrical properties and the optical properties of the conductive films on the substrate (film) having the transparent conductive layers according to the present invention.

[Method for Forming Pattern after Formation of Transparent Conductive Layer]

A method for forming the transparent conductive layer pattern having satisfactory conductivity and optical properties will be described below, in which the method includes forming the transparent conductive layers on the entire surface of the transparent substrate film by a known application technique or printing technique and patterning the transparent conductive layers by an etching technique, a laser scribing technique, a lift-off method, or the like. In particular, when the conductive substance is a fibrous conductive substance, the method described below is preferably employed.

In the case where a periodic pattern used for, for example, the transparent conductive layers for capacitive touch panels is formed on the transparent substrate or transparent film substrate with the fibrous conductive substance as described above, there are problems of the aggregation of the fibrous conductive substance and the ensuring of electrical contact between fibers of the fibrous conductive substance as described above. It is also necessary to increase the opening ratio of the conductive fibers in an entangled state and maintain high light transmittance of the transparent conductive layers. Thus, it is often the case that a coating material to form the transparent conductive layers does not contain a resin component enough to directly form the pattern by a printing method. It is often difficult to perform printing for the formation of the pattern because of its low viscosity.

In such cases, a uniform transparent conductive layer is formed on the transparent substrate or transparent film substrate in advance. An unnecessary transparent conductive layer portion is removed by various methods. Alternatively, only a necessary pattern is cut out. Thereby, patterned transparent conductive layers can be formed.

Thus, preferably, a dispersion of the conductive substance contains no binder resin from the viewpoint of improving conductive performance because contact between the conductive substance fibers is not inhibited in the transparent conductive films as long as a binder resin is not used. Accordingly, it is possible to ensure the conductivity between the conductive substance fibers and further reduce the electrical resistance value of the resulting conductive layers. Since the dispersion of the conductive substance contains no binder resin, in the case where a transparent conductive film is formed on the substrate, part of the transparent conductive coating film can be easily detached from the transparent film substrate in the subsequent step, which is also preferred. In a step of fixing the patterned transparent conductive layers on the transparent substrate or the transparent film substrate with a coating material for a protective layer, the transparent conductive layers are impregnated with the coating material for the protective layer. The fact that the dispersion of the transparent conductive substance contains no binder resin indicates that the transparent conductive layers have a larger number of gaps. Thus, the fixation by the impregnation with the coating material for the protective layer is not inhibited, which is preferred.

Preferably, the dispersion of the fibrous conductive substance, which is the coating material for a transparent conductive layer, contains no binder resin in view of improvement in conductive performance. If the dispersion contains a binder resin, preferably, the dispersion has a significantly low binder resin content and contains only a minimum amount of the binder resin required to at least temporarily form a coating film. In the case of the transparent conductive layers formed from the transparent conductive coating material, the presence of the binder resin does not inhibit contact between the conductive substance fibers, thereby ensuring the conductivity between the fibers of the fibrous conductive substance to further reduce the electrical resistance value of the resulting conductive layers. In the case where the dispersion of the fibrous conductive substance contains no binder resin, when the transparent conductive film is formed on the substrate, the transparent conductive film is easily detached from the transparent (film) substrate in the subsequent step. Thus, the pattern of the transparent conductive layers can be easily formed, which is also preferred.

In general, regardless of the shape of a conductive substance or a patterning method, when a conductive film is formed on a substrate or film by application or printing, the binder resin content of a coating material or ink is preferably is minimized. In particular, in the case where a transparent conductive layer is formed on a transparent substrate with a transparent conductive coating material containing a fibrous transparent conductive substance, the transparent conductive layer is preferably formed by the following procedure: The transparent conductive coating material which contains the fibrous conductive substance and which preferably contains no binder resin is applied onto the transparent substrate. After contacts between fibers of the fibrous transparent conductive substance are sufficiently ensured, a resin to fix the fibrous transparent conductive substance is infiltrated into gaps formed between the fibers of the transparent conductive substance, as needed. The resin is cured to form a protective layer. Thereby, the transparent conductive layer is formed. In the case where the transparent conductive layer is subjected to patterning, the patterning is preferably performed after contacts between fibers of the fibrous transparent conductive substance are sufficiently ensured and before the resin to fix the transparent conductive substance is infiltrated.

Thus, in the case where the transparent conductive layer is formed on the entire surface of the transparent substrate or transparent film substrate and then patterned to form the patterned transparent conductive layers, the following steps are preferably performed:

(1) a step of forming the transparent conductive layer on the substrate by application, the transparent conductive layer being detachable at the time of patterning in the subsequent step;

(2) a step of applying the coating material for the protective layer onto the uniform transparent conductive layers or on the entire surface of the substrate including the patterned transparent conductive layers, thereby fixing the transparent conductive layer on the substrate.

When the transparent conductive layer is formed with the transparent conductive coating material containing no binder resin or containing a very small amount of a binder resin or when the transparent conductive layer is subsequently patterned, the binder resin-containing coating material for the protective layer is then applied onto the transparent conductive layer, as needed. The coating material for the protective layer is allowed to reach the conductive layer by impregnation, thereby strongly fixing the transparent conductive layer to the transparent substrate. Hence, the fact that the dispersion of the transparent conductive substance contains no binder resin indicates that the transparent conductive layers have a larger number of gaps. Thus, the fixation by the impregnation with the coating material for the protective layer is not inhibited, which is preferred.

The use of an excessively large amount of the binder resin which is used when the transparent conductive layer is formed on the transparent substrate and which has a function to fix the transparent conductive substance to the substrate increases the surface resistivity of the conductive layer because the conductive substance in the conductive layer is completely covered and filled. Thus, a final state of the conductive substance exposed at the surface of the conductive layer is checked, and the amount of the binder resin needs to be adjusted in such a manner that a surface resistivity appropriate for the intended use is obtained.

After the conductive coating film is formed on the substrate, in the case where the conductive layer is subjected to pressure treatment to increase the number of contact points between particles of the conductive substance in order to improve the filling rate of the conductive substance to improve the conductivity, if an excessively large amount of the binder resin is used, the effect of pressurization is reduced because of its cushioning effect.

In the method for producing the transparent conductive layer, after the formation of the detachable conductive coating film on the transparent substrate, in order to increase the conductivity of the transparent conductive layer, a pressure step may be performed to increase the number of contact points and the contact area at crossing portions in the transparent conductive substance in the transparent conductive layer formed by application, thereby ensuring the contact. In particular, in the case of using the fibrous conductive substance, in which the number of contact points and the contact area between fibers of the conductive substance are small, the pressure step is effective.

Specifically, the step of pressurizing the crossing portions in the conductive substance is a step of pressuring a surface of the transparent conductive layer. In the case where the transparent conductive substance is fine conductive particles, the step is a step of improving the density of the fine particles to increase the number of contact points and the contact area of the fine particles. In the case where the transparent conductive substance has a fibrous shape, more particularly, a wire-like shape, such as metal nanowires, the step is a step of applying a pressure to the transparent conductive layer containing dispersed network-like substance from directly above to compress the transparent conductive layer, thereby increasing the number of contact points between the metal nanowires therein. This step reduces the contact resistance between the fine conductive particles or between the metal nanowires.

This step may be usually performed by, a known method for pressurizing a surface of a coating film, and the method is not particularly limited thereto. Examples of the method include a flat-plate pressing method in which a transparent conductive layer formed by application is arranged between two flat plates that can apply pressure and a pressure is then applied for a certain period of time; and a calender method in which a transparent conductive layer is interposed between two rolls that can apply pressure, a linear pressure is applied, and rotating the rolls applies a pressure to the entire surfaces.

In the calender method using rolls, the pressure applied to the transparent conductive layer is in the range of 500 kN/m$^2$ to 50,000 kN/m$^2$, preferably 1,000 kN/m$^2$ to 10,000 kN/m$^2$, and more preferably 2,000 kN/m$^2$ to 5,000 kN/m$^2$.

The coating material for a transparent conductive layer or the ink for a transparent conductive layer may contain a resin in an amount which does not reduce the conductivity of the coating film on the substrate or the detachability of the coating film from the substrate and which does not impair the step of fixing the conductive layers with the resin in the coating material for the protective layer. The type and the amount of resin may be appropriately selected within ranges in which the foregoing properties are provided.

The dispersion of the conductive substance may contain the foregoing resin and an additive within the above range of the amount added in order to adjust the viscosity, to prevent corrosion, to improve adhesiveness to the substrate, and to control the dispersibility of the conductive substance. Examples of appropriate additives and a binding agent include, but are not limited to, carboxymethyl cellulose (CMC), 2-hydroxyethyl cellulose (HEC), hydroxypropyl methylcellulose (HPMC), methylcellulose (MC), polyvinyl alcohol (PVA), tripropylene glycol (TPG), xanthan gum (XG), surfactants, such as ethoxylates, alkoxylates, ethylene oxide, and propylene oxide, and copolymers thereof, sulfonates, sulfates, disulfonates, sulfosuccinates, phosphoric esters, and fluorine-based surfactants.

Non-polymer organic compounds, such as 2-alkoxyethanols, β-diketones, and alkyl acetates may also be used as a film-forming agent.

The step of patterning the transparent conductive layer on the substrate may be performed after the step of fixing the transparent conductive layer to the substrate. In the case where the step of patterning the transparent conductive layer is performed after the step of forming the transparent conductive layer on the substrate by application and before the step of fixing the transparent conductive layer to the substrate, the layer is more easily patterned, and a larger number of techniques can be used. After patterning, the coating material for the protective layer is applied onto the entire surface of the transparent substrate partially covered with the patterned transparent conductive layers, thereby enabling the patterned transparent conductive layers to be reliably fixed to the transparent substrate, which is preferred.

With respect to a specific method for forming the patterned transparent conductive layers on the substrate, methods, such as patterning with a laser beam and photoetching, may be employed. The use of a method for forming desirably patterned transparent conductive layers is preferred in that treatment can be continuously performed through an application step, treatment, e.g., photoirradiation or masking, is not required, wet treatment, such as etching, is not required, and stable conductivity can be ensured, the method including detaching an unnecessary portion of the transparent conductive layer formed on the substrate with a detachment base having a negative pattern with respect to a pattern to be formed, the negative pattern being composed of an adhesive coating material, thereby forming desired patterned transparent conductive layers.

In this case, the following step may be performed: A negative pattern with respect to a pattern including the conductive regions (A) and the high-resistance region (B) having the two-dimensional arrangement pattern with a fine period or size that is not recognized by the naked eye, is formed on a base with, for example, a heat-sensitive adhesive to produce a detachment base. An unnecessary portion, corresponding to the negative pattern, of a uniform transparent conductive layer formed on a transparent substrate or transparent film substrate is detached from the substrate with the detachment base.

That is, in the case where the substrate having the transparent conductive layers or the film having the transparent conductive layers of the present invention is produced with the transparent conductive coating material containing the fibrous conductive substance, a transparent conductive film is formed on the entire surface of a transparent substrate or transparent film substrate. A detachment base, such as a detachment film, is prepared, the detachment base including an adhesive layer on a support, the adhesive layer having a pattern that is the inverse, in terms of negative and positive portions, of a repetitive pattern to be formed on the transparent substrate. The adhesive layer is bonded by pressure to the transparent conductive film and then detached therefrom, thereby forming the repetitive pattern. In this case, the detachment film is produced by application or printing on the support with a single printing plate having a portion configured to perform printing for a negative pattern section of a region corresponding to the regions (A) and a portion configured to perform printing a negative pattern section of a region including the subregions (C) and the subregions (D) in the region (B). Thereby, the detachment film can be formed in an application step or a printing step in one operation.

Alternatively, the negative pattern itself bonded to the detachment film and transferred in the form of a pattern may be used as a conductive pattern. To achieve the stable surface conductivity of the transparent conductive layer, preferably, a surface of the transparent conductive film initially formed on the transparent film substrate is directly used as a surface of a patterned transparent conductive layer using the pattern left on the transparent substrate.

[Formation of Patterned Transparent Conductive Layer by Lift-Off Method]

With respect to a method for producing a film having patterned transparent conductive layers by removing an unnecessary portion from a uniform transparent conductive layer produced in advance with a detachment base including an adhesive layer having a negative pattern to form a film having patterned transparent conductive layers, individual steps in the method will be described in more detail below.

That is, as a method in which patterned transparent conductive layers are formed from a uniform transparent conductive layer containing a fibrous conductive substance and in which transparent conductive films including patterned transparent conductive layers fixed on a transparent substrate are eventually produced, a method including the following steps may be exemplified:
(1) a step of forming a detachable transparent conductive layer on a substrate by application;
(2) a step of forming a negative-patterned heat-sensitive adhesive layer on a support;
(3) a step of bonding the substrate to the support in such a manner that the transparent conductive layer and the heat-sensitive adhesive layer are in close contact with each other;
(4) a step of detaching the support from the substrate to transfer a portion of the transparent conductive layer in close contact with the heat-sensitive adhesive layer onto the heat-sensitive adhesive layer, thereby forming a transparent conductive layer pattern on the substrate; and
(5) a step of applying a coating material for a protective layer to the entire surface of the substrate including the transparent conductive layer pattern to fix the transparent conductive layer to the substrate.

[Formation of Detachable Transparent Conductive Layer]

A detachable transparent conductive coating film used in the present invention is formed by applying a transparent conductive coating material containing a fine transparent conductive substance dispersed in a liquid medium (dispersion medium) onto a transparent film substrate. Here, the transparent conductive substance includes a substance in which even if the substance itself is not transparent, the substance can be used to form a transparent conductive layer by controlling the shape and the content thereof. The transparent conductive layer of the present invention preferably has a surface resistivity of 0.01Ω/□ to 1000Ω/□, high transparency in the visible light region, a total light transmittance of 80% or more, and is detachable from the substrate. Here, the term "detachable" indicates that in the case where a detachment base having at least an adhesive layer on a surface thereof is prepared, where the adhesive layer of the detachment base and a transparent conductive layer are superimposed and bonded to each other, and where the detachment base is then detached, the transparent conductive layer on the substrate can be detached without causing internal fracture or damaging the substrate and the interface between the substrate and the transparent conductive layer.

Figure 18:
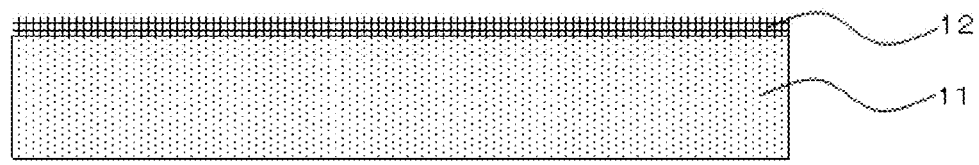
FIG. 18 is a cross-sectional view of a substrate having a transparent conductive layer, the substrate serving as a substrate having a transparent conductive layer of the present invention.

In the case where a transparent conductive coating film is formed on a transparent substrate with the foregoing substances, a dispersion containing a transparent conductive substance, a dispersion medium, and, if necessary, a resin is applied onto a transparent substrate (11) and dried to form a uniform conductive coating film (12) on the transparent substrate, as illustrated in FIG. 18.

A known coating method, such as spray coating, bar coating, roll coating, die coating, ink jet coating, screen coating, or dip coating may be employed.

When the thickness of the transparent conductive layer is excessively small, a sufficient conductivity as a conductor tends not to be achieved. When the thickness of the transparent conductive layer is excessively large, transparency tends to be impaired due to an increase in the haze value, a decrease in the total light transmittance, and the like. Usually, the thickness of the transparent conductive layer is appropriately adjusted to be in the range of 10 nm to 10 μm. In the case where the conductive substance itself is not transparent, e.g., in the case of metal nanowires, the transparency is easily lost by an increase in the thickness of the conductive layer. Thus, a conductive layer having a smaller thickness is often formed. In this case, the conductive layer has a large number of openings. The thickness of the conductive layer is preferably in the range of 10 nm to 500 nm, more preferably 30 nm to 300 nm, and most preferably 50 nm to 150 nm in terms of an average thickness measured with a contact-type film thickness meter.

As means for easily detaching the transparent conductive layer (12) provided on the transparent substrate (11) from the substrate, an underlying layer that facilitates the detachment of the transparent conductive layer (12) may be provided on the coating surface of the transparent substrate in advance. In such a case, it is preferable to form an underlying layer that does not impair the transparency of the substrate having the conductive layer (12) thereon, the conductivity, and adhesiveness of a binder resin in the coating material for a protective layer. The composition and the structure of the underlying layer may be appropriately selected, depending on the type of the transparent substrate (11) and the composition of the coating material for a protective layer, the coating material penetrating through the transparent conductive layer (12) from above and reaching the substrate in the subsequent step.

The patterning operations of the transparent conductive layer in the steps (2) to (4), different from the case of forming patterned transparent conductive layers by direct printing on a transparent substrate, will be described below.

[Formation of Support (Detachment Base) Having Patterned Heat-Sensitive Adhesive Layer (Step (2))]

Figure 19:
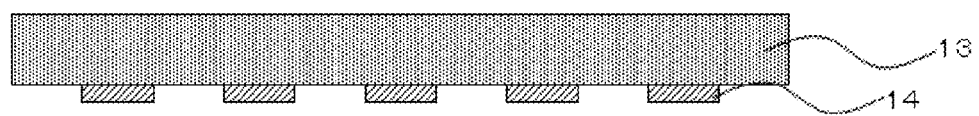
FIG. 19 is a cross-sectional view of a support including a negative-patterned heat-sensitive adhesive used for the production of a substrate having a transparent conductive layer of the present invention.

To partially detach the transparent conductive layer formed on the substrate from the substrate, a detachment base is formed. As illustrated in FIG. 19, a detachment base (20) used in the present invention includes a negative-patterned heat-sensitive adhesive layer (14) on a film-like support (13). The detachment base (20) may be formed by applying a coating material for a heat-sensitive adhesive layer, the coating material containing a heat-sensitive adhesive and a solvent, onto the film-like support (13) so as to form a negative pattern that is the inverse of a desired conductive pattern to be formed on a substrate.

While the heat-sensitive adhesive does not exhibit adhesiveness at all at room temperature, it exhibits adhesiveness when being heated. The heat-sensitive adhesive in the heat-sensitive adhesive layer formed on the support is not particularly limited as long as the heat-sensitive adhesive has affinity to both of the transparent conductive layer formed on the transparent substrate and the support and can strongly bond the transparent conductive layer to the support. Various known heat-sensitive adhesives may be used. With respect to the temperature at which adhesiveness is exhibited, in the case where the heat-sensitive adhesive penetrates through gaps between particles of the conductive substance in the transparent conductive layer and satisfactorily adheres to the conductive substance and where a film is used as the transparent substrate, the adhesiveness is preferably exhibited at a temperature that does not significantly exceed the glass transition temperature of the substrate film. When the support is detached at about room temperature after heating, preferably, the heat-sensitive adhesive preferably exhibits strong adhesion to both the conductive substance and the support, so that satisfactory detachment is performed.

Examples of the heat-sensitive adhesive include polyurethane adhesives, polyester adhesives, vinyl chloride/vinyl acetate copolymer adhesives, and acrylic adhesives. Among these adhesives, a heat-sensitive adhesive which has a glass transition temperature Tg of room temperature or higher, which has an acid group, e.g., a carboxylic acid group or a sulfonic acid group, and which contains, as a base resin, an amorphous polyester resin or a polyester polyurethane resin, is preferred. The glass transition temperature is preferably in the range of 20° C. to 100° C. For the purpose of controlling the heat-sensitive temperature, an appropriate amount of another resin having compatibility with the above base resin and a glass transition temperature Tg different from that of the base resin may be mixed.

If necessary, polyolefin resin particles may be added as an anti-blocking agent to the heat-sensitive adhesive. In particular, polyethylene resin particles or polypropylene resin particles are preferably added. More specifically, it is preferable to add high-density polyethylene resin particles, low-density polyethylene resin particles, modified-polyethylene resin particles, degradable low-density polyethylene resin particles, or degradable polypropylene resin particles. The polyethylene resin particles and degradable polyethylene resin particles have a weight-average particle diameter of 0.1 to 25 µm. When these particles have a flat shape or a scaly shape, the particles preferably have a weight-average particle diameter of 3 to 25 µm, a molecular weight of 1,000 to 29,000, and a melting point of 100° C. to 150° C.

The solvent used in the coating material for the heat-sensitive adhesive layer is not particularly limited. Any non-corrosive solvent may be used as long as the solvent satisfactorily dissolves or disperses the binder resin used in the heat-sensitive adhesive. Examples of the more appropriate solvents include water, alcohols, ketones, cyclic ether compounds, such as tetrahydrofuran, hydrocarbons, such as cyclohexane, and aromatic solvents, such as benzene, toluene, and xylene. The solvents are preferably volatile and preferably have a boiling point of 200° C. or lower, more preferably 150° C. or lower, and still more preferably 100° C. or lower.

Typical examples of the support used in the detachment base in the present invention include films composed of a plastic, such as a polyester, e.g., polyethylene terephthalate or polyethylene naphthalate, a polyolefin, e.g., polyethylene, polypropylene, polystyrene, or EVA, a vinyl resin, e.g., polyvinyl chloride or polyvinylidene chloride, polysulfone, polyethersulfone, polycarbonate, polyamide, polyimide, or an acrylic resin. Among these compounds, preferable are films that are not thermally deformed in the step of bringing the transparent conductive layer into close contact with the heat-sensitive adhesive layer and bonding these layers to each other under heating.

These supports may be colored as long as the object of the present invention is not inhibited. These supports may be used as a single layer or as a multilayer film including a combination of two or more layers. Among these supports, a polyethylene terephthalate film is the most suitable from the standpoint of transparency, heat resistance, handleability, and the cost. When the thickness of this transparent plastic base is small, heat resistance is poor. When the thickness of this plastic transparent base is large, the heat capacity increases, and a long heating time is necessary to exhibit adhesiveness in the heating of the heat-sensitive adhesive. Accordingly, the thickness of the transparent plastic base is preferably 5 µm to 100 µm, more preferably 10 µm to 50 µm, and still more preferably 15 µm to 30 µm.

The heat-sensitive adhesive layer on the support is formed so as to have a negative pattern that is the inverse of a desired transparent conductive pattern to be formed on the substrate.

A known printing method may be employed as a method for forming the negative pattern of the adhesive. The method is not particularly limited. Any known method may be employed as long as the heat-sensitive adhesive can have a sufficient thickness such that the heat-sensitive adhesive layer that exhibits adhesiveness due to heating is satisfactorily bonded to the transparent conductive layer on the substrate in the subsequent step. For example, a gravure printing method, an offset printing method, a gravure offset printing method, a screen printing method, an ink jet printing method, or the like can be employed. The heat-sensitive adhesive layer preferably has a thickness of 0.05 µm to 5.0 µm, more preferably 0.1 µm to 2.0 µm, and still more preferably 0.2 µm to 1.0 µm.

With respect to the conditions of manufacture of a printing plate of the present invention, in the case of an AM screening, screen ruling that expresses the resolution of printing is 170 lines per inch (lpi) or more and preferably 260 lpi or more and 500 lpi or less. When screen ruling is low, the pattern is easily visually recognized as dots. Furthermore, it is difficult to form an insulating pattern and a conductive pattern in a small region. When screen ruling is high, a pattern having a low dot pitch and good visual recognition properties can be formed. However, dots are easily connected together, so it is difficult to control conduction and insulation.

Figure 9:
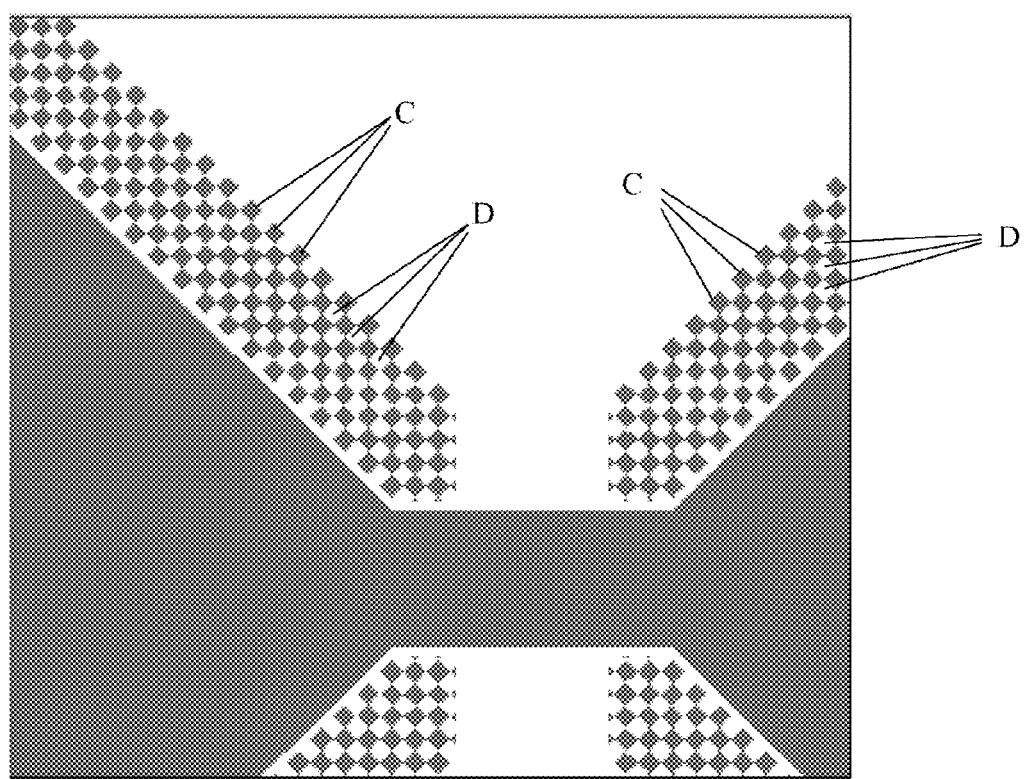
FIG. 9 is a schematic enlarged view of a checkered insulating dummy pattern having an area of about 50%, the dummy pattern being formed in gaps between electrode portions.

A method for forming an insulating dummy pattern for AM screening will be described below with reference to the attached drawings. FIG. 8 is a schematic enlarged view when the area of cells constituting a negative pattern is about 50%. Patterning is performed using the negative pattern of the heat-sensitive adhesive formed by printing with this printing plate, thereby forming an insulating pattern illustrated in a schematic enlarged view of FIG. 9.

Figure 10:
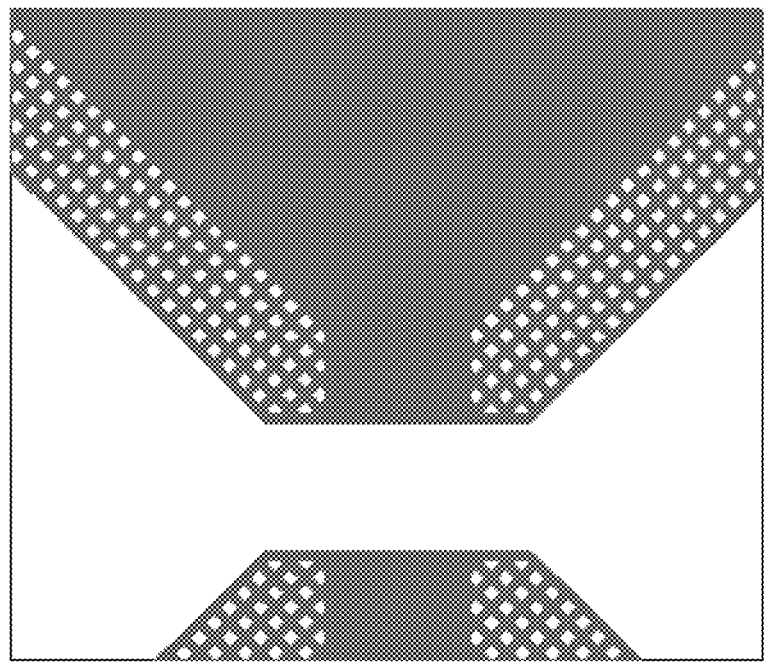
FIG. 10 is a schematic enlarged view of a grid-like negative pattern for a heat-sensitive adhesive, the negative pattern being used to form an insulating dummy pattern.
Figure 11:
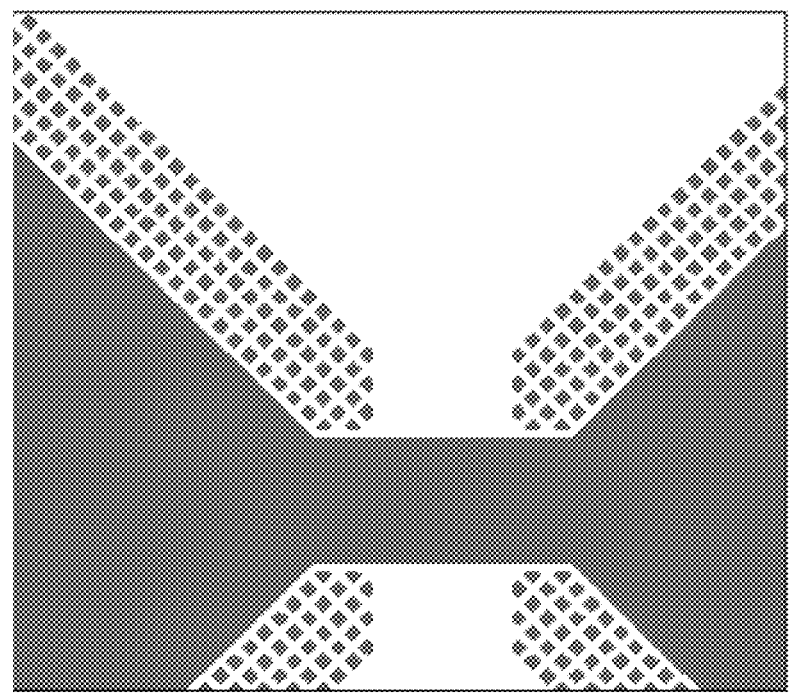
FIG. 11 is a schematic enlarged view of a grid-like insulating dummy pattern formed in gaps between electrode portions.

An example of a method for forming an insulating pattern with a freely-selected cell shape obtained by digital plate-making technology using laser is a method for forming grid-like grooves on a surface of a printing plate. In this case, a negative pattern for a heat-sensitive adhesive used to form an insulating dummy pattern is illustrated in FIG. 10. Patterning is performed using the negative pattern of the heat-sensitive adhesive formed by printing with this printing plate, thereby forming an insulating pattern illustrated in a schematic enlarged view of FIG. 11.

Figure 12:
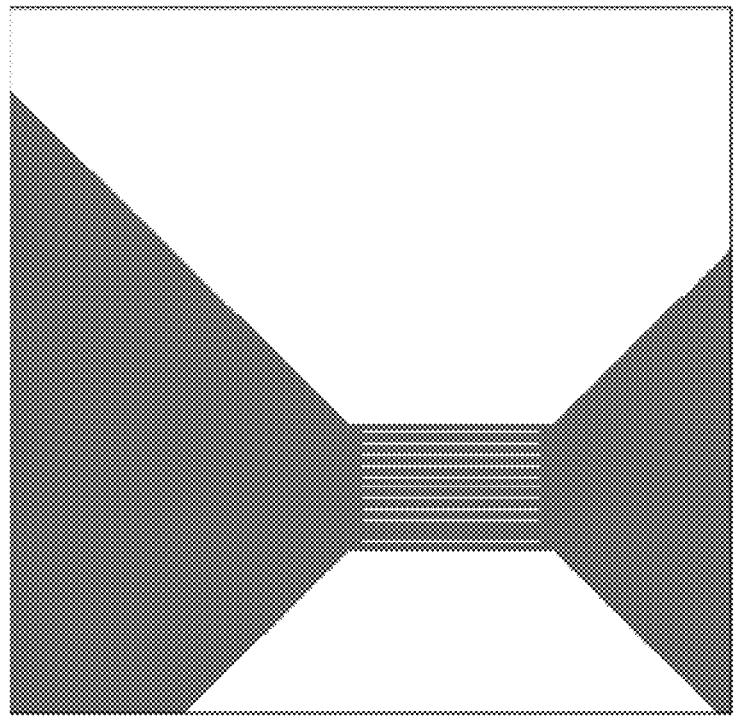
FIG. 12 is a schematic enlarged view of stripe-shaped uncovered portions formed in a linking portion that connects electrode portions.
Figure 13:
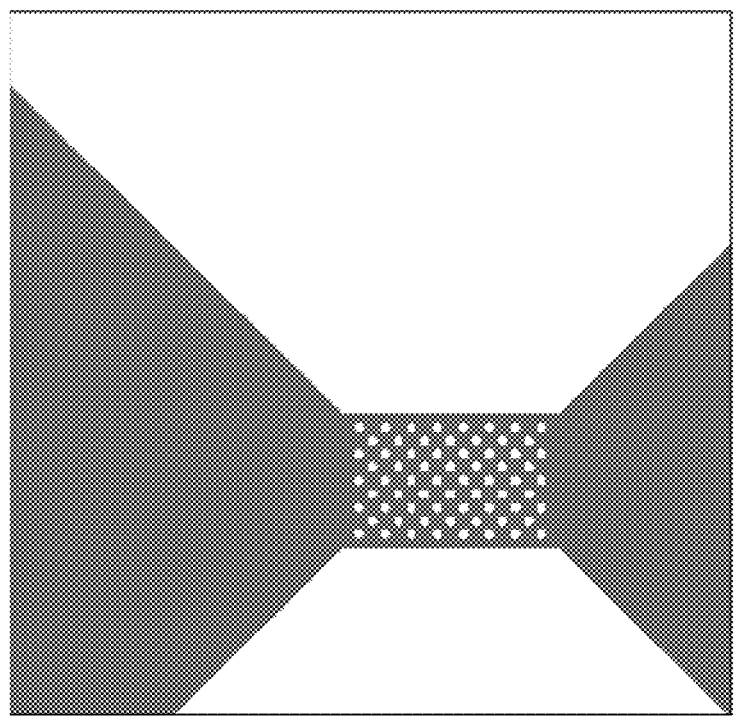
FIG. 13 is a schematic enlarged view of dot-like uncovered portions formed in a linking portion that connects electrode portions.
Figure 14:
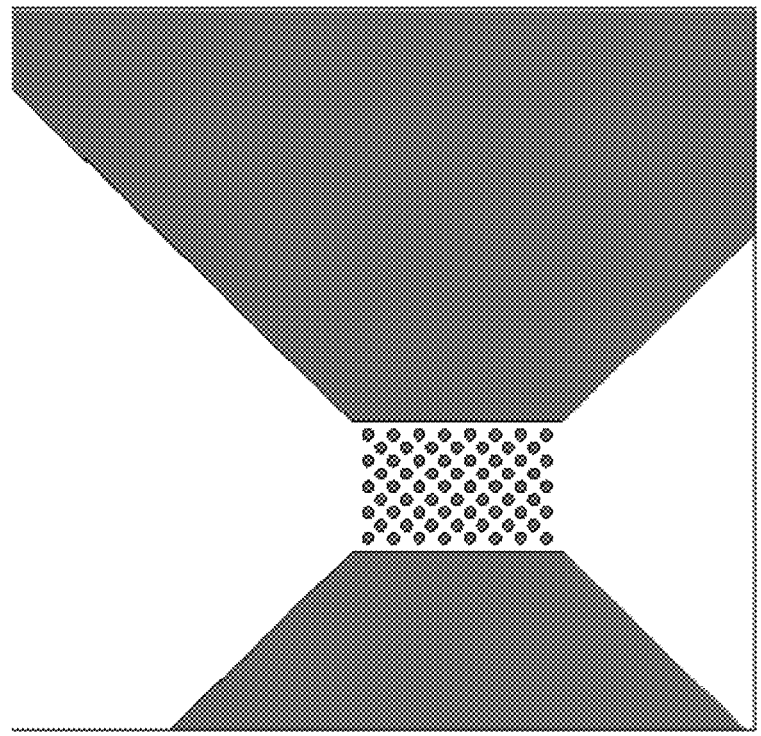
FIG. 14 is a schematic enlarged view of a negative pattern for a heat-sensitive adhesive, the negative pattern being used to form dot-like uncovered portions formed in a linking portion that connects electrode portions.
Figure 15:
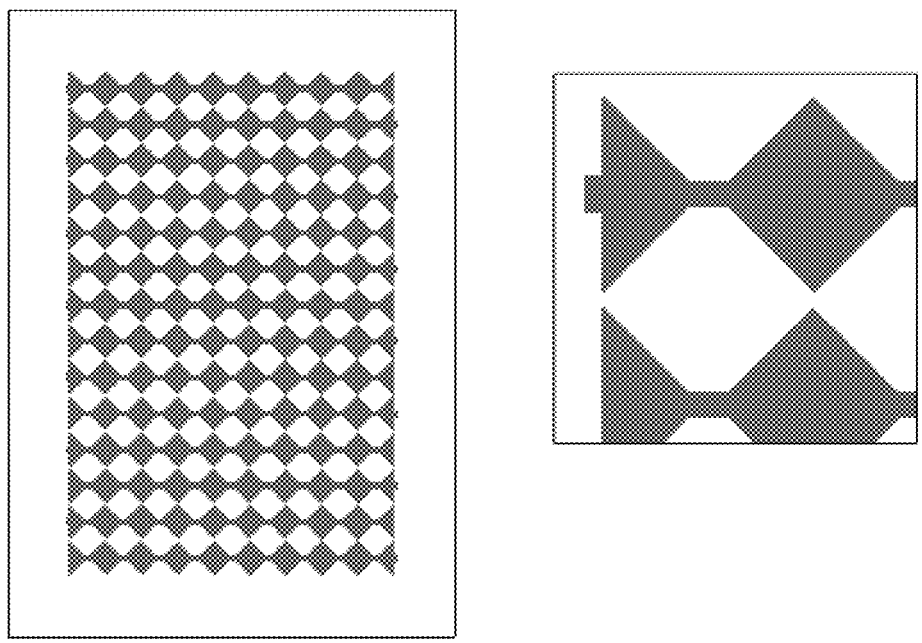
FIG. 15 illustrates a schematic view and an enlarged view of a conventional substrate covered with a conductive pattern for X electrodes, the substrate corresponding to a comparative example.
Figure 16:
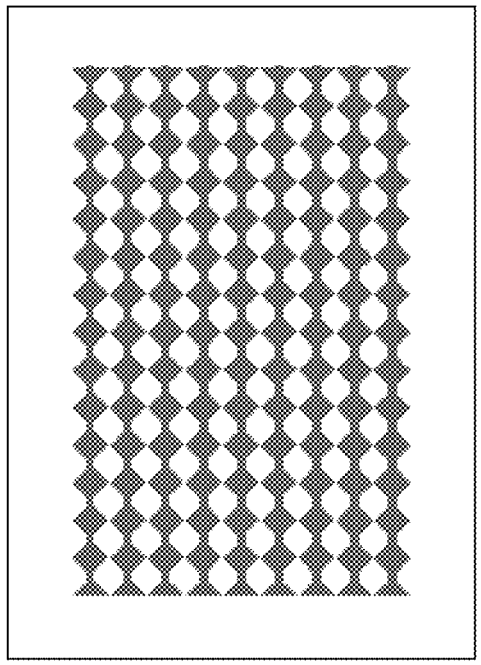
FIG. 16 illustrates a schematic view and an enlarged view of a conventional substrate covered with a conductive pattern for Y electrodes, the substrate corresponding to a comparative example.
Figure 16:
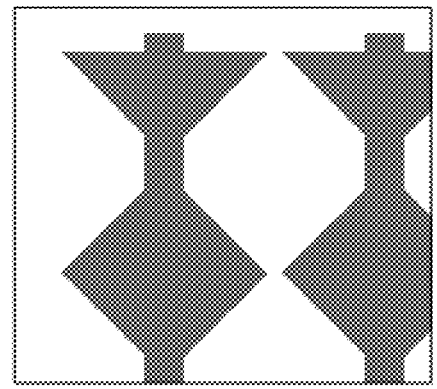
Figure 17:
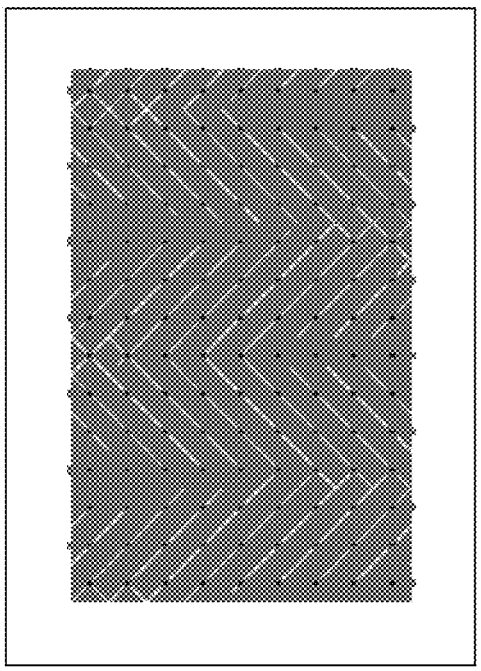
FIG. 17 is a schematic view of a state in which conventional substrates covered with conductive patterns for X and Y electrodes are superimposed, the substrates corresponding to a comparative example.
Figure 17:
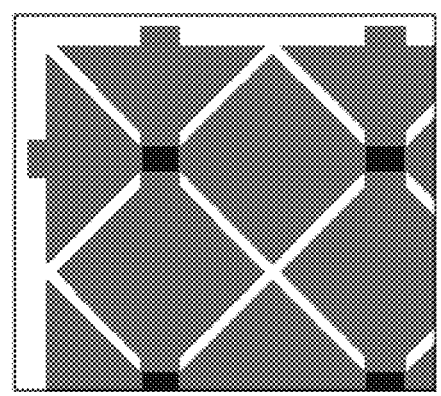

A method for forming a conductive dummy pattern will be described below with reference to the attached drawings. With respect to a method for forming a conductive dummy pattern, there are a method in which stripe-shaped portions that are not covered with the conductive film are formed in a portion that connects electrodes as illustrated in FIG. 12; and a method in which dot-like portions that are not covered with the conductive film are formed in a portion that connects electrodes as illustrated in FIG. 13. The conductive dummy pattern can be formed by appropriately using the digital plate-making technology using laser, the AM screening method, the FM screening method, and so forth, which are used in the method for forming the insulating dummy pattern. As a detachment base to form a pattern as illustrated in FIG. 13, a heat-sensitive adhesive layer having a negative pattern on a support as illustrated in FIG. 14 may be formed.

[Step of Patterning Transparent Conductive Layer]

A step of patterning a transparent conductive layer containing a fibrous conductive substance used in the present invention includes (3) the step of bonding the substrate to the support in such a manner that the transparent conductive layer and the negative-patterned heat-sensitive adhesive layer are in close contact with each other; and (4) the step of detaching the support from the substrate to transfer a portion of the transparent conductive layer in close contact with the heat-sensitive adhesive layer onto the heat-sensitive adhesive layer, so that a desired portion of the transparent conductive layer is left to form a pattern. In the bonding step, the substrate having the transparent conductive layer thereon and the detachment base including a support having a negative-patterned heat-sensitive adhesive layer thereon are bonded to each other in such a manner that the transparent conductive layer and the heat-sensitive adhesive layer are in close contact with each other, heated, and pressurized. In particular, in the case where the transparent conductive layer contains no binder resin or contains only a small amount of a binder resin, the heat-sensitive adhesive is softened by the heating and pressurization of the heat-sensitive adhesive layer and permeates through gaps between fine conductive particles in the transparent conductive layer or through a network of a fibrous conductive substance. Thus, the heat-sensitive adhesive and the conductive substance in the transparent conductive layer are bonded to each other.

Subsequently, the heat-sensitive adhesive layer in the bonded portion is cooled to about room temperature. The support is then detached from the substrate to remove a portion of the transparent conductive layer bonded to the heat-sensitive adhesive layer, thereby forming a positive pattern of the transparent conductive layer on the substrate.

Figure 20:
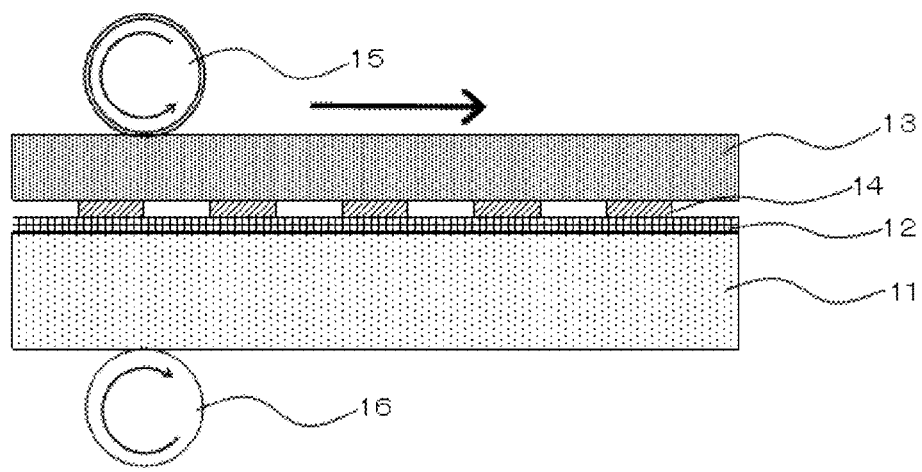
FIG. 20 is a schematic cross-sectional view of a bonding step of bonding a substrate having a transparent conductive layer of the present invention to a support including a negative-patterned heat-sensitive adhesive under heat and pressure.

As a bonding method used in patterning the transparent conductive layer, any method can be employed without particular limitations as long as thermal deformation of the substrate is not caused by the heating and pressurization during the bonding. Examples of the method include a flat plate lamination method in which the transparent conductive layer of the substrate and the heat-sensitive adhesive layer on the support of the detachment base are arranged between two flat plates that can apply heat and pressure, and heat and pressure are then applied for a certain period of time; a roll lamination method in which, as illustrated in FIG. 20, the substrate (11) having the transparent conductive layer (12) and the support (13) having the heat-sensitive adhesive layer (14) are conveyed and interposed between a nip of a pair of rolls (15) and (16), one or both of which being able to be heated, and heated and linearly pressurized, and the entire surfaces are pressurized by rotating the rolls (15) and (16).

In particular, in the latter roll lamination method, a roll-to-roll continuous process can be performed using the film substrate and a film-like detachment base. Thus, excellent production efficiency can be achieved. As described above, one or both of the rolls used in the roll lamination method can be heated. The material of the rolls is not particularly limited as long as the transparent conductive layer and the heat-sensitive adhesive layer are satisfactorily thermally bonded to each other and thermal deformation of the substrate is not caused. With respect to the types of rolls used, there are rigid rolls, which are mainly metal rolls, and elastic rolls, which are mainly composed of heat-resistant rubber. All the combinations of metal/metal, metal/elastic, and elastic/elastic may be used. To exhibit adhesiveness of the heat-sensitive adhesive in the nip of the pair of the rolls, the elastic/elastic roll pair or the elastic/metal roll pair, with which the nip width can be increased and the heating time can be extended, is preferred.

As for the processing conditions during bonding, conditions of the temperature and pressure at which the adhesiveness of the heat-sensitive adhesive to the transparent conductive layer is exhibited without causing thermal deformation of the film substrate are appropriately selected. For example, the processing temperature is preferably 70° C. to 150° C., more preferably 80° C. to 130° C., and still more preferably 90° C. to 120° C. Regarding the pressure, a minimum linear pressure at which a satisfactory transfer state is provided in the range of 10 kN/m to 60 kN/m may be selected in terms of roll linear pressure.

The heat-sensitive adhesive layer portion may be preliminarily heated before bonding, as needed. If air bubbles are mixed in the heat-sensitive adhesive layer, partial bonding failure between the heat-sensitive adhesive layer and the conductive layer occurs. Thus, detachment of the conductive layer using the detachment base tends to be incomplete. To prevent air bubbles from being mixed, in the bonding step, the heating and pressurization of the heat-sensitive adhesive layer portion of the detachment base may be conduced in a reduced pressure atmosphere.

Figure 21:
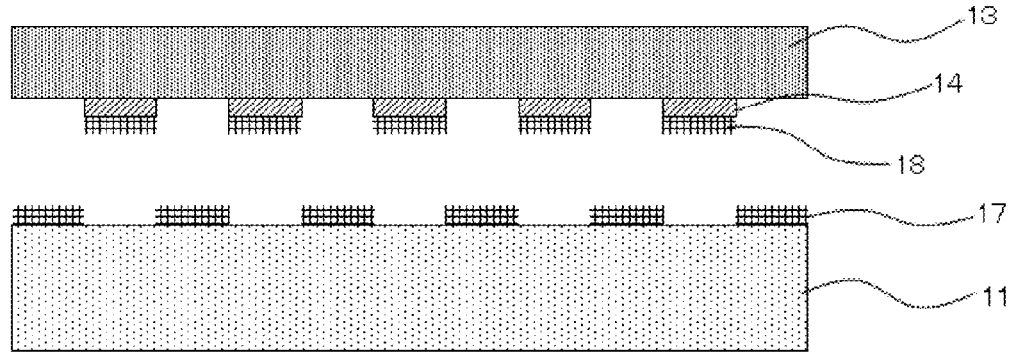
FIG. 21 is a schematic cross-sectional view of a detachment step of detaching a substrate having a transparent conductive layer of the present invention to a support including a negative-patterned heat-sensitive adhesive.

In the step of detaching the bonded substrate and detachment base, the substrate having the transparent conductive layer thereon and the detachment base including a support having a patterned heat-sensitive adhesive layer thereon are cooled to about room temperature. The support is then detached from the substrate. As illustrated in FIG. 21, a transparent conductive layer (18) bonded to the heat-sensitive adhesive layer in the detachment step, the transparent conductive layer (18) being located at a position corresponding to a portion where the heat-sensitive adhesive layer (14) on the support (13) is formed, is detached from the substrate together with the heat-sensitive adhesive layer (14). A transparent conductive layer (17) located at a position that does not correspond to the portion where the heat-sensitive adhesive is formed remains on the body (11) as a positive pattern of the transparent conductive layer. Thereby, the pattern of the transparent conductive layer is completed on the substrate. Prior to the detachment of the detachment base, cooling, such as the blowing of cooling air onto the support of the detachment base and the heat-sensitive adhesive layer portion, may be performed. Such cooling is effective in order to satisfactorily perform the detachment and to prevent a patterning defect, such as the generation of an undetached portion.

Patterning by the lift-off method, in which a negative pattern is formed on a detachment base using a heat-sensitive adhesive and an unnecessary portion of a transparent conductive layer that is uniformly formed on a substrate is detached from the transparent conductive layer, is determined only on the basis of the presence or absence of the heat-sensitive adhesive applied onto the support of the detachment base. The heat-sensitive adhesive is not applied to a portion of the detachment base corresponding to a portion of the transparent conductive layer that is not to be detached. Accordingly, the transparent conductive layer can be reliably left on the substrate. It is possible to prevent a reduction in the light transmittance of the transparent conductive layer due to an unnecessary heat-sensitive adhesive remaining on the transparent conductive layer.

[Application of Coating Material for Protective Layer (Fixing of Transparent Conductive Layer)]

After a desired pattern of the transparent conductive layer is formed on the substrate, a coating material for a protective layer is applied over the entire surface of the substrate and the transparent conductive layer formed on the substrate.

Figure 22:
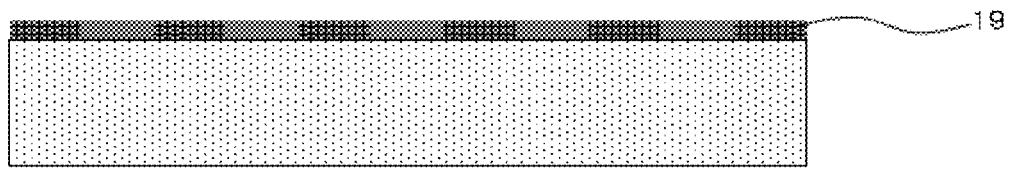
FIG. 22 is a cross-sectional view of a substrate after a coating material for a protective layer is applied onto a patterned transparent conductive layer of the present invention to form a protective layer.

A step of applying a coating material for a protective layer is performed as follows. As illustrated in FIG. 22, the coating material for a protective layer is applied over the entire surface of the substrate that is partially covered with a transparent conductive layer pattern formed in the bonding step and the detachment step described above. A solvent component is evaporated to cure a resin component contained, thereby forming a protective layer (19). Through this step, the surface of the transparent conductive layer is covered and protected. In addition, the coating material for a protective layer reaches the substrate while filling gaps between conductive fine particles in the transparent conductive layer or gaps of a network formed by a fibrous, preferably, wire-shaped conductive substance. When the coating material is cured, the coating material strongly fixes the whole transparent conductive layer to the substrate, thereby forming the substrate having the transparent conductive layer.

Materials and combinations of the materials that may be used as the binder resin used in fixing the transparent conductive layer will be described below. The fixing by the binder resin is performed by forming a solid polymer matrix. The solid polymer matrix is formed by the polymerization of a monomer or an oligomer (10 to 100 monomers) contained in the coating material for a protective layer by light irradiation or heating or by cross-linking a resin contained in the coating material for a protective layer by drying and heating. Alternatively, the fixing by the binder resin is performed by forming a cross-linked coating film of a binder resin in a solvent by removing the solvent. The coating film is not limited to a coating film formed by being cured through polymerization or a cross-linking process. However, from the viewpoint of durability and abrasion resistance of the coating film, the binder resin is preferably fixed through polymerization of a monomer by visible light, ultraviolet light, an electron beam, heating, or the like, or cross-linking of a polymer with a cross-linking agent.

An organic polymer used as a binder preferably contains a polar functional group bonded to a carbon skeleton. Examples of the polar functional group include a carboxyl group, an ester group, a ketone group, a nitrile group, an amino group, a phosphate group, a sulfonyl group, a sulfonate group, a poly(alkylene glycol) group, and an alcoholic hydroxy group. Examples of the polymer useful as a binder include acrylic resins, alkyd resins, polyurethane, acrylic urethane, polycarbonate, polyester, polystyrene, polyacetal, polyamide, polyvinyl alcohol, polyvinyl acetate, and cellulose. Examples of an inorganic polymer include siloxane polymers formed by the hydrolysis and condensation of tetraalkoxysilanes.

Examples of a polymerizable organic monomer serving as a monomer or an oligomer include acrylate- and methacrylate-type monomers and oligomers, such as methyl acrylate, methyl methacrylate, methoxypolyethylene glycol methacrylate, glycidyl acrylate, ethylene oxide-modified phosphoric acid acrylate, urethane acrylate, polyethylene glycol methacrylate, polybutadiene acrylate, and polyester acrylate; other vinyl monomers, such as mono(2-methacroyloxyethyl) acid phosphate, acrylic acid, methacrylic acid, itaconic acid, acrylonitrile, methacrylonitrile, styrene, and vinyltoluene; and epoxide compounds, such as bisphenol A diglycidyl ether.

Examples of a polymerizable inorganic monomer serving as a monomer include mineral acid salts, organic acid salts, alkoxides, and complexes (chelates) of metals, such as Si, Ti, Zr, Al, Sn, Fe, Co, Ni, Cu, Zn, Pb, Ag, In, Sb, Pt, and Au. They are polymerized by hydrolysis or thermal decomposition and are ultimately formed into inorganic compounds (e.g., metal oxides, hydroxides, carbides, and metals). Thus, they are treated as inorganic monomers in the present invention. These inorganic monomers may also be used in the form of a partial hydrolysate thereof. While specific examples of a metal compound will be illustrated below, the metallic compound is not limited thereto.

One or two or more of the foregoing polymer binders (polymers, monomers, or oligomers) are dissolved in or diluted with an organic solvent, as required, to prepare a liquid having a viscosity of 25 cps or less, preferably 10 cps or less. This liquid is used for the impregnation of a coating film formed in a first step. When the viscosity of this liquid is higher than 25 cps, the liquid does not sufficiently permeate inside the coating film so as to reach the substrate at the time of the impregnation of the coating film. Consequently, a desired adhesiveness and effect of improving the film strength cannot be provided. When the liquid is highly viscous, an excessive amount of liquid is accumulated on the transparent conductive layer formed in the first step, thereby forming an insulating layer that does not contain fine conductive particles and significantly reducing the conductivity.

The organic solvent used in the dissolution or dilution is not particularly limited. In addition to the various organic solvents as exemplified in the step of forming a coating film described in (1), liquid organic compounds used as the film-forming agent in the step of forming a coating film described in (1) and water may also be used as the solvent.

If necessary, a curing catalyst (in the case of heat curing), a photopolymerization initiator (in the case of ultraviolet curing), a cross-linking agent, a hydrolysis catalyst (e.g., an acid), a surfactant, a pH-adjusting agent, and the like may be added to the liquid for impregnation.

Examples of appropriate solvents include water, alcohols, ketones, cyclic ether compounds (such as tetrahydrofuran), hydrocarbons (such as cyclohexane), and aromatic solvents (such as benzene, toluene, and xylene). More preferably, the solvents are volatile and have a boiling point of 200° C. or lower, 150° C. or lower, or 100° C. or lower.

The protective coating material may contain a cross-linking agent, a polymerization initiator, stabilizers (e.g., an antioxidant, an ultraviolet stabilizer for extending the life of products, and a polymerization inhibitor for improving the storage period), a surfactant, and other agents having the same effects. The protective coating material may further contain a corrosion inhibitor for preventing corrosion of metal nanowires.

Any known wet coating method may be employed as the method for forming the protective layer without particular limitations. Specific examples thereof include spray coating, bar coating, roll coating, die coating, ink jet coating, screen coating, and dip coating.

In the case where the protective layer is formed while impregnating the transparent conductive layer with the coating material for the protective layer, when the thickness of the protective layer after the coating and drying is excessively smaller than that of the transparent conductive layer before the coating, the functions of the protective layer, such as abrasion resistance, wear resistance, and weather resistance, are reduced. When the thickness of the protective layer is excessively large, the contact resistance as the conductor is increased because the conductive substance is completely embedded in the protective layer.

When the transparent conductive layer having a thickness of 50 to 150 nm is formed, the thickness of the coating material for a protective layer after coating and drying is preferably 30 to 150 nm. The application of the coating material may be controlled so as to achieve desired values of the surface resistivity, the haze, and so forth in consideration of the thickness of the transparent conductive layer. The thickness of the coating material for a protective layer after coating and drying is more preferably 40 to 175 nm and most preferably 50 to 150 nm. When the dry thickness of the coating material for a protective layer is 30 nm or more, the protective function of the protective layer tends to act more satisfactorily, depending on the thickness of the transparent conductive layer. When the dry thickness of the coating material for a protective layer is 150 nm or less, a more satisfactory conductive performance tends to be ensured.

The resulting film having the transparent conductive layers is combined with other electronic components and used as various products or components for products. Furthermore, a necessary structure is added thereto, so that the film is used as a sheet for touch panels in various display apparatuses.

The film having the transparent conductive layers of the present invention may be combined with a necessary structure and used as a capacitive touch panel.

In the film having the transparent conductive layers used for a touch panel having a position detection function, a transparent conductive pattern that functions as a capacitor electrode is arranged on the transparent substrate. Usually, a stack of a sheet for X-axis detection and a sheet for Y-axis detection is used. Each of the sheets has a repetitive pattern of the transparent conductive regions. The repetitive pattern has linear structures, each of which includes specific repeating units that are linked together in one direction. The linear structures are arranged parallel to one another at regular intervals.

To prevent, in particular, the transparent conductive pattern from being visually recognized, the transparent conductive pattern is preferably formed in such a manner that when the sheets are stacked, a portion where the patterns are superimposed on each other or a portion where the patterns are not superimposed at all is minimized.

To this end, the film having the transparent conductive layers preferably has a transparent conductive pattern such that when the linear structures, which are the specific repeating units, of the transparent conductive regions are arranged parallel to one another at regular intervals to cover the transparent substrate, similar linear patterns orthogonal to the linear structures are provided as uncovered regions on the transparent substrate.

For example, a film having transparent conductive layers may be used, the film having a transparent conductive pattern in which the transparent conductive regions having linear structures of specific repeating units, which have the substantially rhombic regions (A), linked together in one direction, are arranged parallel to one another at regular intervals, and the film having liner similar patterns orthogonal to the linear structures are provided as uncovered regions on a transparent substrate.

In the case of such a film having transparent conductive layers, two films are orthogonally superimposed and bonded together with the transparent conductive layers inside in such a manner that each of the transparent conductive regions is opposite a corresponding one of the high-resistance regions, and may be used as a pattern for a touch panel. At this time, the conductive region is formed so as to be smaller than the high-resistance region. When the two films having the transparent conductive layers are superimposed, regions where no transparent conductive layer is present are formed between the transparent conductive regions that are located opposite each other. The optical properties of the regions differ from those of other regions. Thus, the regions are easily visually recognized as a pattern. Furthermore, portions where the linear transparent conductive patterns are orthogonally superimposed also differ in optical properties from other conductive regions. Thus, the pattern of the portions can be visually recognized.

In such a case, the high-resistance regions between the conductive regions are formed of regions including the subregions (C) and the subregions (D) in such a manner that a value of the optical properties of the high-resistance regions is about 50% of a value of the conductive regions while maintaining satisfactory insulation between the conductive regions. As a result, the optical properties of the high-resistance regions are substantially equal to those of the conductive regions when the films are superimposed, so that the conductive patterns are not easily visually recognized. The portions where the conductive regions are orthogonally superimposed on each other are also formed of regions including the subregions (C) and the subregions (D) in such a manner that the optical properties of the conductive regions are allowed to be close to those of the high-resistance regions rather than the conductive regions while maintaining satisfactory conductivity. As a result, the optical properties of the conductive regions are not significantly different from those of other conductive regions.

In this way, in the case where the superimposed portions are formed of the regions including the subregions (C) and the subregions (D), the optical properties can be changed while maintaining satisfactory conductivity or insulation, thereby suppressing the ease of visual recognition of the conductive patterns. In particular, regarding the formation of the subregions (C) and the subregions (D), they are formed in such a manner that the optical properties are gradually changed from the optical properties of the conductive regions at boundary portions between the superimposed portions and the conductive regions. This facilitates the visual recognition of the boundary portions between the superimposed portions and the conductive regions. Furthermore, when they are superimposed, the optical properties as a whole can be brought close to the optical properties of the conductive regions because regions having gradients, in terms of optical properties, in opposite directions are superimposed.

EXAMPLES

With respect to the case where a transparent conductive substance is silver nanowires, the present invention will be more specifically described below by way of examples of the case where a film having transparent conductive layers for a touch panel and a transparent conductive film laminate for a touch panel are produced. However, the present invention is not limited to these examples.

Example 1

Synthesis of Silver Nanowires

Silver nanowires are synthesized by a method in which a polyol is used, the method being described in Y. Sun, B. Gates, B. Mayers, & Y. Xia, "Crystalline silver nanowires by soft solution processing" Nano letters, (2002), 2(2) 165-168, then by dissolving silver sulfate in ethylene glycol in the presence of polyvinylpyrrolidone (PVP), and reducing the silver sulfate. Specifically, nanowires used in the present invention were synthesized by the amended polyol method described in U.S. Provisional Patent Application No. 60/815, 627 applied by Cambrios Technologies Corporation.

[Formation of Transparent Conductive Layer]

An aqueous dispersion (ClearOhm™, Ink-A AQ, manufactured by Cambrios Technologies Corporation) containing, as metal nanowires to form a transparent conductive layer, 0.5% w/v silver nanowires synthesized by the foregoing method and having a minor axis diameter of about 70 nm to 80 nm and an aspect ratio of 100 or more in an aqueous medium was applied onto a transparent film substrate of a highly transparent PET film (Cosmoshine A4100, manufactured by Toyobo Co., Ltd.) having a thickness of 50 μm with a slot die coater in such a manner that the resulting film had a wet thickness of 25 μm. The resulting film was dried. Then a pressurization process was performed at a pressure of 2000 kN/m² to form a transparent conductive layer (see FIG. 18).

[Formation of Detachment Base Including Support Having Negative-Patterned Heat-Sensitive Adhesive Layer]

Next, 100 parts by weight of CRISVON NT-810-45 (a polyurethane resin manufactured by DIC Corporation, 45% solution) was dissolved in 62.5 parts by weight of methyl ethyl ketone and 62.5 parts by weight of toluene to prepare a heat-sensitive adhesive. With respect to typical physical properties of this polyurethane resin, a glass transition temperature determined from a peak value of tan δ obtained by viscoelasticity measurement (the rate of temperature increase: 3° C./min) is 42° C., a tensile fracture strength and a tensile fracture elongation determined at a cross head speed of 300 mm/min are 277×10E5 Pa and 665%, respectively, and a flow-starting temperature determined by a measurement with a high-pressure flow tester (die: 1φ×1 L, pressurization: 98 N) is 90° C. The heat-sensitive adhesive solution was applied by printing onto a 23-μm-thick PET film (Teijin Tetron Film G2, manufactured by Teijin DuPont Films) serving as a support to form a negative pattern with respect to a transparent conductive layer pattern to be formed on the transparent film substrate.

Here, electrode patterns for a projective-capacitive touch panel, the electrode patterns illustrated in FIGS. 1 and 2, were used as desired conductive layer patterns to be formed on the transparent film substrate. Each of the patterns includes diamond-shaped electrode portions (capacitive elements) having a length of a side of 3.7 mm and an inner angle of 90°. The widths of the linking portions (bridges) configured to connect the electrode portions to each other are 0.7 mm for X electrodes and 1.0 mm for Y electrodes. As illustrated in FIG. 3, the linear electrode patterns were arranged in such a manner that when the X electrodes were superimposed on the Y electrodes, the linear linking portions that connected the diamond-shaped electrodes were superimposed, the diamond-shaped electrode portions were not superimposed, and the gap between the electrode portions was 0.3 mm.

As a dummy pattern configured to improve viewability, conductive dummy pattern regions, in which dot-like regions not covered with the transparent conductive films and having a diameter of 40 μm were arranged with a pitch of 73 μm, were formed in the linking portions which were formed of the transparent conductive films and which connected the capacitive elements to each other.

Insulating dummy pattern regions, in which dot-like regions covered with the transparent conductive films and having a diameter of 40 μm were arranged with a pitch of 73 μm, were formed in the gap portions where no transparent conductive film is present when the X electrodes were orthogonally superimposed on the Y electrodes.

The former linking portions were conductive and had conductivity comparable to that of electrode line portions where no dummy pattern was formed. The haze value of the linking portions was 60% of that of the electrode line portions where no dummy pattern was formed. The latter gap portions were not conductive and had high resistance comparable to that of electrode line-free portions. The haze value of the gap portions was 40% of that of the electrode line portions where no dummy pattern was formed.

Figure 23:
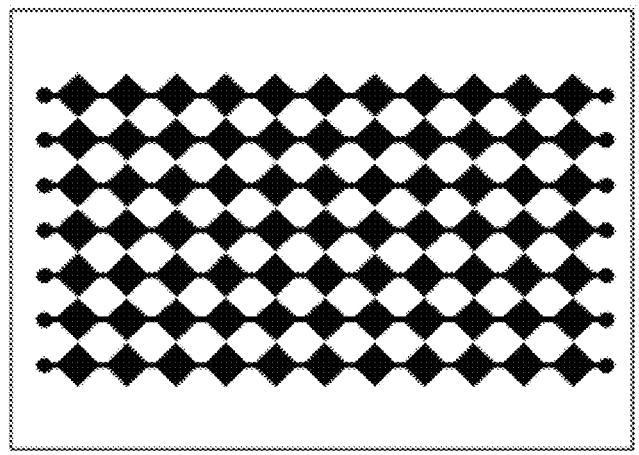
FIG. 23 is a plan view of a pattern for the X-axis of a transparent conductive layer for a touch panel, the pattern being provided on a substrate having a transparent conductive layer of the present invention.
Figure 24:
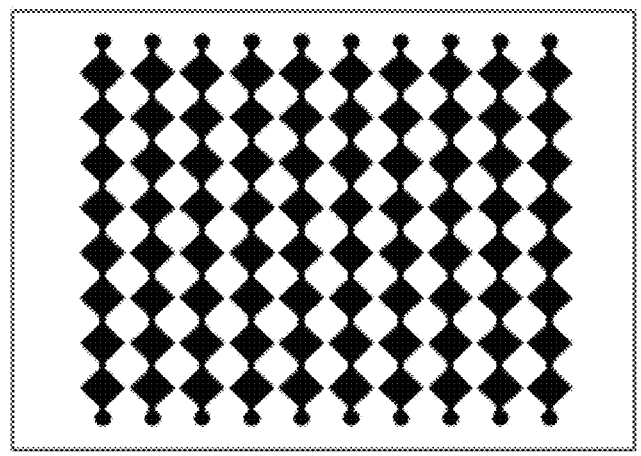
FIG. 24 is a plan view of a pattern for the Y-axis of a transparent conductive layer for a touch panel, the pattern being provided on a substrate having a transparent conductive layer of the present invention.
Figure 25:
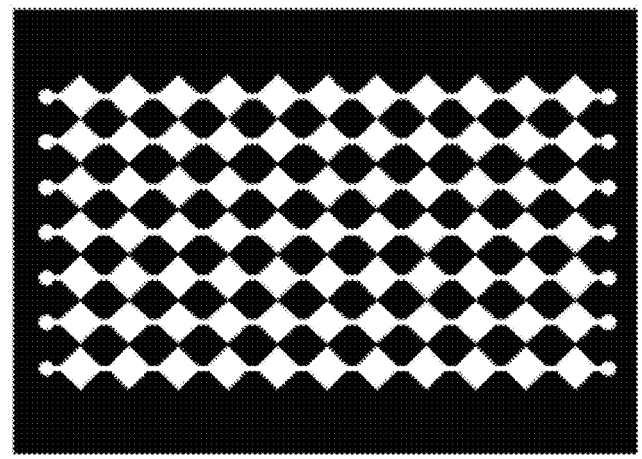
FIG. 25 is a plan view of a negative pattern for the X-axis, the negative pattern being used for a heat-sensitive adhesive formed on a support in the production of a substrate having a transparent conductive layer of the present invention.
Figure 26:
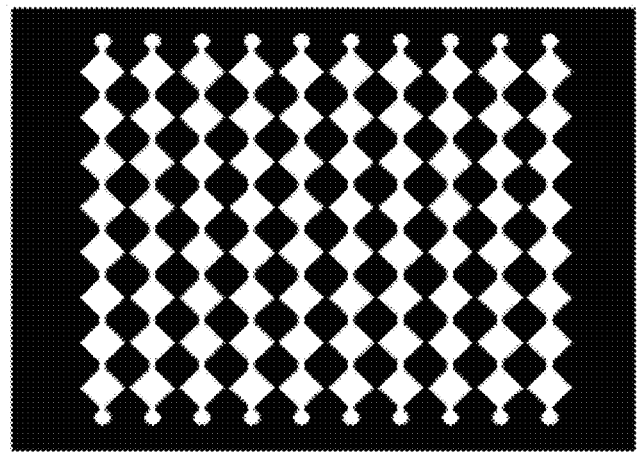
FIG. 26 is a plan view of a negative pattern for the Y-axis, the negative pattern being used for a heat-sensitive adhesive formed on a support in the production of a substrate having a transparent conductive layer of the present invention.

Here, patterns, illustrated in FIGS. 25 and 26, which are negative patterns with respect to patterns, illustrated in FIGS. 23 and 24, to be formed of the transparent conductive layers were formed on the support from a gravure plate with a screen ruling of 350 lpi. At this time, regions configured to form negative patterns of the dummy pattern portions were formed on the same gravure plate while the size and depth of gravure cells were adjusted. The negative patterns were simultaneously formed by a gravure printing method.

A heat-sensitive adhesive was applied by printing on the support in such a manner that the resulting heat-sensitive adhesive layers had a dry thickness of 0.5 μm to 0.8 thereby forming detachment bases having negative image patterns composed of the heat-sensitive adhesive, as illustrated in FIGS. 25 and 26 (FIG. 19).

[Step of Patterning Transparent Conductive Layer]

Next, the substrate having the transparent conductive layer thereon, the substrate being prepared as a roll-shaped coated material, and the detachment base having the negative-patterned heat-sensitive adhesive layer were superimposed in such a manner that the transparent conductive layer and the heat-sensitive adhesive layer faced each other while traveling. The substrate and the detachment base were continuously bonded using a laminator including a heating and pressure nip formed by a metal heating roll and a heat-resistant silicone roll under the conditions of a heating roll temperature of 110° C., a roll nip pressure (linear pressure) of 30 kN/m, and a speed of 5 m/min (FIG. 20). At the time when the temperature at a bonded portion decreased to about room temperature, the detachment base was continuously detached from the transparent film substrate while the bonded material was traveled, thereby providing a film having a patterned transparent conductive layer, i.e., the film having the transparent conductive layer with a desired pattern on the transparent film substrate. The film having the transparent conductive layer was continuously formed in the detachment step to provide a roll-shaped film having the transparent conductive layer (FIG. 21).

A patterned transparent conductive layer portion was observed with a microscope. The transparent conductive layer portion on the transparent film substrate was not damaged in the detachment step using the detachment base. In addition, the transparent conductive layer did not remain on a portion of the detachment base from which the transparent conductive layer was detached. The detachment was completely performed. Furthermore, the heat-sensitive adhesive did not adhere to the film having the conductive layer.

[Formation of Protective Layer by Application of Coating Material for Protective Layer (Fixing of Transparent Conductive Layer)]

A coating material for a protective layer was prepared by sufficiently dissolving 100 parts of an acrylic resin (ACRYDIC A-815-45, manufactured by DIC Corporation, nonvolatile content: 45%) and 7.2 parts of an isocyanate curing agent (BURNOCK DN-980, manufactured by DIC Corporation, nonvolatile content: 75%) in 2200 parts of methyl ethyl ketone and 2200 parts of toluene.

The coating material for a protective layer was applied over the entire surface of the transparent film substrate having the patterned transparent conductive layers thereon using a slot die coater in such a manner that the resulting coating film had a wet thickness of 10 μm, while filling gaps between network nanowires in the transparent conductive layer with the coating material for a protective layer. The resulting coating film was dried to form a protective layer coating film having a dry thickness of about 0.1 μm. The protective layer coating film was allowed to stand in an atmosphere at 60° C. for 24 hours to perform a curing reaction between the isocyanate curing agent and the acrylic resin, thereby forming a protective layer (FIG. 22). In this way, films having transparent conductive layers were produced, the films having two types of transparent conductive layer patterns for a touch panel, the patterns being illustrated in FIGS. 23 and 24. A capacitive touch panel is fabricated using these films having the patterned transparent conductive layers through the following step: For example, two types of films having the transparent conductive layers, i.e., one is a film having patterned transparent conductive layers for X electrodes, and the other is a film having patterned transparent conductive layers for Y electrodes, are superimposed together in such a manner that the transparent conductive layers are arranged in the same direction (for example, upward direction) and transparent conductive layer formation portions of one of the films are alternately superimposed on conductive layer-free portions of the other, with an OCA (optical adhesive sheet) provided therebetween. To perform the evaluation of the resulting transparent conductive layer patterns as a film having transparent conductive layers for a projective-capacitive touch panel or as a transparent conductive film laminate for a touch panel, measurements described below were performed. Table 1 illustrates the results.

Example 2

Unlike Example 1, as a dummy pattern configured to improve viewability, conductive dummy pattern regions, in which dot-like regions not covered with the transparent conductive films and having a diameter of 30 µm were arranged with a pitch of 73 µm, were formed in the linking portions which were formed of the transparent conductive films and which connected the electrode portions to each other. Furthermore, insulating dummy pattern regions, in which dot-like regions covered with the transparent conductive films and having a diameter of 30 µm were arranged with a pitch of 73 µm, were formed in the gap portions where no transparent conductive film is present when the X electrodes were orthogonally superimposed on the Y electrodes.

The former linking portions that connected the electrode portions to each other were conductive and had conductivity comparable to that of the electrode portions. The haze value of the linking portions was 70% of that of the electrode line portions where no dummy pattern was formed. The latter gap portions were not conductive and had high resistance comparable to that of electrode line-free portions. The haze value of the gap portions was 30% of that of the electrode line portions where no dummy pattern was formed. Except for those mentioned above, films having transparent conductive layers for a projective-capacitive touch panel were produced as in Example 1.

Subsequently, as with Example 1, two types of films having the transparent conductive layers were superimposed and bonded together in such a manner that the transparent conductive layers were arranged in the same direction (for example, upward direction) and transparent conductive layer formation portions, which were electrode line portions, of one of the films were alternately superimposed on conductive layer-free portions of the other, with an OCA (optical adhesive sheet) provided therebetween. To perform the evaluation of the formed transparent conductive layer patterns as a film having transparent conductive layers for a projective-capacitive touch panel or as a transparent conductive film laminate for a touch panel, the following measurements were performed. Table 1 illustrates the results.

Comparative Example 1

The widths of the linking portions between the capacitive elements (linking portions configured to connect the electrode portions to each other) were 0.4 mm for X electrodes and 0.6 mm for Y electrodes in such a manner that the resistance of a linear X electrode and a linear Y electrode was equal to that in Example 1. Electrode patterns for a projective-capacitive touch panel, which are illustrated in FIGS. 23 and 24, were produced without the formation of the fine patterns, formed in Example 1, in the capacitive element-linking portions (linking portions) and the gap portions between the capacitive elements (gap portions between electrodes) when the X electrodes were superimposed on the Y electrodes.

Subsequently, as with Example 1, a transparent conductive film laminate for a touch panel was produced through a step of superimposing two types of films having the transparent conductive layers together in such a manner that the transparent conductive layers are arranged in the same direction (for example, upward direction) and transparent conductive layer formation portions of one of the films are alternately superimposed on conductive layer-free portions of the other, with an OCA (optical adhesive sheet) provided therebetween.

To perform the evaluation of the transparent conductive layer patterns of the resulting transparent conductive film laminate for a touch panel as a film having transparent conductive layers for a projective-capacitive touch panel or as a transparent conductive film laminate for a touch panel, measurements described below were performed. Table 1 illustrates the results.

Comparative Example 2

As with Example 1, a transparent conductive layer was formed on a transparent film substrate. Then patterning was not performed, and a protective layer was formed by application in the same way as in Example 1. Conductive microfibers in the pattern-less uniform transparent conductive layer were partially broken or eliminated with a YAG laser to cut off conduction to other transparent conductive patterns, thus forming electrode line-free portions serving as non-conducting pattern portions. Thereby, transparent conductive layer patterns were formed in Comparative Example 2. In the transparent conductive layer patterns, the electrode line portions serving as conductive pattern portions differ from the electrode line-free portions serving as the non-conducting pattern portions in electrical properties, i.e., the presence or absence of conduction to other regions. However, there is little difference in structure or composition between the electrode line portions and the electrode line-free portions. Thus, the hue, the light transmittance, and the haze value of the conductive pattern portions are substantially the same as those of the non-conducting pattern portions. Hence, these portions can scarcely be distinguished visually.

With respect to the films having the patterned transparent conductive layers for a touch panel and the transparent conductive layer patterns of the transparent conductive film laminates formed by bonding the films, the films and the laminates being produced in the examples and the comparative examples, evaluation of the films and the laminates was made to examine properties as a film having transparent conductive layers for a capacitive touch panel or a transparent conductive laminate for a touch panel. The evaluation items and the measuring methods used in the evaluation will be described below.

[Surface Resistivity]

Samples of the films having the patterned transparent conductive layers before the bonding with the optical adhesive sheets (OCA) and samples of the transparent conductive film laminates after the bonding were prepared so as to have a size of 10 cm×10 cm square. The surface resistivity (Ω/□) of each of the samples was measured while pressing four probes on a central portion of the sample using a four-probe resistivity meter (Loresta-EP, manufactured by Mitsubishi Chemical Analytech Co., Ltd). The measurement was performed for the electrode line portions and the electrode line-free portions. For this measurement, a pattern for measurement, the pattern having a larger area, was formed for evaluation at the same time of the formation of the pattern for the touch panel. Five positions were selected from different portions of the pattern for measurement, and coating film samples each having a size of 10 cm×10 cm square were prepared from the positions. The measurement of the samples was conducted, and the average of the measured values was determined.

[Measurement of Resistance of Transparent Conductive Layer Pattern for Touch Panel]

With respect to the films having the patterned transparent conductive layers before the bonding with the optical adhesive sheets (OCA) and the transparent conductive film laminates after the bonding, the electrical resistance of the transparent conductive pattern of each of the films and the laminates was measured by applying a tester to resistance measuring portions at both terminals of the respective transparent conductive patterns. Furthermore, the electrical resistance between adjacent transparent conductive patterns was also measured.

In the transparent conductive layer patterns for a touch panel used in the present invention, as illustrated in FIGS. 23 and 24, diamond patterns are connected to each other in an X-axis direction or in a Y-axis direction, and adjacent pattern sequences are insulated from each other. A pattern of a terminal for wiring is formed at each end of a pattern sequence. If the pattern sequence is disconnected at a halfway position, an appropriate resistance cannot be obtained in the measurement at both terminals. Furthermore, if adjacent pattern sequences are short-circuited at a halfway position, adjacent terminals of the pattern sequences are not satisfactorily insulated from each other. Accordingly, whether or not the patterning of the transparent conductive layer is satisfactorily performed can be examined by measuring the resistance between terminals at both ends of a pattern sequence and the resistance between adjacent terminals. Five different touch panel patterns were selected at a central portion of a material film. The measurement was performed at one pair of terminals at both ends and at one pair of adjacent terminals in each pattern. Thus, the measurement at terminals at both ends and the measurement at adjacent terminals were each performed at five positions, and the average of the measurement results was determined.

[Measurement of Optical Properties (Total Light Transmittance and Haze)]

The total light transmittance and the haze values of the films having the patterned transparent conductive layers before the bonding with the optical adhesive sheets (OCA) and the transparent conductive film laminates after the bonding were measured.

A total light transmittance (Tt) {in accordance with JIS K-7361, NDH-2000 measuring method 1} and a haze (the degree of haze) (Hz) {in accordance with JIS K-7136, NDH-2000 measuring method 3} were measured using an integrating sphere-type total light transmittance measuring device (NDH-2000 manufactured by Nippon Denshoku Industries Co., Ltd.). This measurement was also performed for a substrate film before the formation of the transparent conductive layer. The haze values of a portion of the substrate film where no transparent conductive film was formed were measured before and after the bonding with the optical adhesive sheet. Before and after the bonding with the optical adhesive sheets, the differences between the measured haze values of the portion of the substrate film and the measured haze values of the electrode portions of the transparent conductive layers, the linking portions connecting the electrode portions to each other, and the gap portions of the X and Y electrodes were determined. With respect to each measurement sample, a pattern for measurement, the pattern having a larger area, was formed at the same time of the formation of the pattern for the touch panel. Five samples of a portion on which the conductive layer was formed, and five samples of a portion from which the conductive layer was detached were prepared from different portions of the pattern for measurement. The measurement was conducted at a central portion of each of the samples, and the average of the measurement results was determined.

| | | Measurement position | Surface resistivity ($\Omega/\square$) | Total light transmittance (Tt) (%) | Haze (Hz) difference from portion where electrode is not formed (%) | $\Delta$Haze ($\Delta$Hz) (%) | Line resistance, X axis Between pattern ends (k$\Omega$) | Line resistance, X axis Between adjacent patterns (k$\Omega$) | Line resistance, Y axis Between pattern ends (k$\Omega$) | Line resistance, Y axis Between adjacent patterns (k$\Omega$) | Visual recognition/ productivity |
|---|---|---|---|---|---|---|---|---|---|---|---|
| Example 1 | Before bonding | Electrode portion | 200 | 92.2 | 1.28 | 1 | 7.8 | ∞ | 8 | ∞ | Gap portions between electrodes: they are not visually recognized at all. Linking portions between electrodes: they are not visually recognized at all. Comprehensive evaluation of visual recognition: ⊙ Productivity: ⊙ |
| | | Gap portion between X and Y electrodes | insulated | 93.0 | 0.68 | 0.4 | | | | | |
| | | Linking portion between electrodes | 200 | 92.5 | 0.88 | 0.6 | | | | | |
| | After Bonding | Electrode portion | 200 | 89.7 | 1.6 | 1.04 | 7.9 | ∞ | 8.2 | ∞ | |
| | | Gap portion between X and Y electrodes | — | 90.6 | 1.4 | 0.84 | | | | | |
| | | Linking portion between electrodes | 200 | 89.0 | 1.74 | 1.18 | | | | | |
| | | Entire pattern | — | 89.8 | 1.62 | 1.06 | — | — | — | — | |
| | | (PET film) | — | 90.2 | 0.43 | — | — | — | — | — | |
| Example 2 | Before Bonding | Electrode portion | 200 | 92.2 | 1.28 | 1 | 7.8 | ∞ | 8 | ∞ | Gap portions between electrodes: they are little visually recognized. Linking portions between electrodes: they are slightly visually recognized because of haze difference but do |
| | | Gap portion between X and Y electrodes | insulated | 93.1 | 0.58 | 0.3 | | | | | |
| | | Linking portion between electrodes | 200 | 92.3 | 0.98 | 0.7 | | | | | |
| | After Bonding | Electrode portion | 200 | 89.7 | 1.6 | 1.04 | 7.9 | ∞ | 8.2 | ∞ | |
| | | Gap portion between X and Y electrodes | — | 90.6 | 1.16 | 0.6 | | | | | |
| | | Linking portion | 200 | 88.7 | 1.96 | 1.40 | | | | | |

| | | Measurement position | Surface resistivity (Ω/□) | Total light transmittance (Tt) (%) | Haze (Hz) difference from portion where electrode is not formed (%) | ΔHaze (ΔHz) (%) | Line resistance, X axis | | Line resistance, Y axis | | Visual recognition/productivity |
|---|---|---|---|---|---|---|---|---|---|---|---|
| | | | | | | | Between pattern ends (kΩ) | Between adjacent patterns (kΩ) | Between pattern ends (kΩ) | Between adjacent patterns (kΩ) | |
| | | between electrodes Entire pattern (PET film) | — — | 89.8 90.2 | 1.62 0.43 | 1.06 — | — | — | — | — | not bother observer. Comprehensive evaluation of visual recognition: ○ Productivity: ⊙ |
| Comparative Example 1 | Before Bonding | Electrode portion | 200 | 92.2 | 1.0 | 0.7 | 7.8 | ∞ | 8 | ∞ | Gap portions between electrodes: they are clearly visually recognized because of difference in haze from electrode portions. Linking portions between electrodes: they are clearly visually recognized because haze doubles by superimposition of linking portions. Comprehensive evaluation of visual recognition: x Productivity: ⊙ |
| | | Gap portion between X and Y electrodes | insulated | 92.8 | 0.4 | 0.1 | | | | | |
| | | Linking portion between electrodes | 200 | 92.2 | 1.28 | 1 | | | | | |
| | After Bonding | Electrode portion | 200 | 89.7 | 1.3 | 0.7 | 7.9 | ∞ | 8.2 | ∞ | |
| | | Gap portion between X and Y electrodes | — | 90.3 | 0.6 | 0 | | | | | |
| | | Linking portion between electrodes | 200 | 88.4 | 2.1 | 1.5 | | | | | |
| | | Entire pattern (PET film) | — — | 89.7 90.2 | 1.62 0.43 | 1.06 — | — | — | — | — | |
| Comparative Example 2 | Before Bonding | Conductive pattern portion | 200 | 92.2 | 1.28 | 1 | 7.8 | ∞ | 8 | ∞ | Gap portions between electrodes: they are not visually recognized at all. Linking portions between electrodes: they are not visually recognized at all. Comprehensive evaluation of visual recognition: ⊙ Productivity: x |
| | | Nonconductive pattern portion | insulated | 92.2 | 1.28 | 1 | | | | | |
| | After Bonding | Electrode portion | 200 | 88.4 | 2.54 | 1.98 | 7.9 | ∞ | 8.2 | ∞ | |
| | | Gap portion between X and Y electrodes | — | 88.4 | 2.54 | 1.98 | | | | | |
| | | Linking portion between electrodes | 200 | 88.4 | 2.54 | 1.98 | | | | | |
| | | Entire pattern (PET film) | — — | 88.4 90.2 | 2.54 0.43 | 1.98 — | — | — | — | — | |

As is apparent from Table 1, in the film having the patterned transparent conductive layers according to the present invention for a touch panel and the transparent conductive film laminate according to the present invention for a touch panel, the haze values of the electrode-linking portions and the regions serving as the gap portions between the X and Y electrodes are adjusted, the electrode-linking portions being superimposed to each other when bonded, and the gap portions being superimposed to each other when bonded, while maintaining satisfactory conductivity of the electrode line portions and satisfactory insulation of the electrode line-free portions. The transparent conductive layer pattern is not visually recognized when used for a capacitive touch panel. Thus, it is possible to produce a touch panel having excellent viewability.

In addition, there is no need to perform a rinse step in an etching process or to use a special apparatus for laser patterning. The dummy patterns configured to improve viewability can be formed simultaneously with the formation of the electrode patterns. Thus, excellent productivity is also achieved.

INDUSTRIAL APPLICABILITY

A transparent conductive layer pattern of a film having patterned transparent conductive layers according to the present invention may be used for organic/inorganic electroluminescent electrodes, electromagnetic wave shielding, electrodes for electronic paper, electrodes for dye-sensitization solar cells, liquid crystal electrodes, and so forth. There is no need to use a special apparatus for production. A pattern configured to improve viewability can be formed simultaneously with the formation of an electrode pattern. In particular, the transparent conductive layer pattern may be used for a transparent electrode for a touch panel.

REFERENCE SIGNS LIST

1 screen panel
2 optically clear adhesive
3 optically clear PET
4 transparent conductive film at electrode portion
5 insulating dummy pattern at gap portion
11 substrate (used to form transparent conductive layer)
12 transparent conductive layer
13 support (used to form negative pattern of heat-sensitive adhesive)
14 heat-sensitive adhesive layer
15 metal roller for heating and pressurization
16 heat-resistant silicone roller for heating and pressurization 17 patterned transparent conductive layer
18 detached transparent conductive layer with heat-sensitive adhesive
19 protective layer (protective layer fixed on substrate by impregnation of transparent conductive layer with coating material for protective layer)
20 detachment base

The invention claimed is:

1. A transparent substrate comprising a transparent conductive layer, the transparent conductive layer having a pattern, the transparent conductive layer being formed of a transparent conductive film containing a binder resin and a conductive substance, wherein the transparent conductive layer includes conductive regions (A) uniformly covered with the transparent conductive film and a high-resistance region (B) provided between the transparent conductive regions (A), wherein the high-resistance region (B) includes subregions (C) covered with the transparent conductive films and subregions (D) not covered with the transparent conductive film, the subregions (C) and the subregions (D) being located in the high-resistance region (B), and wherein the subregions (C) and/or subregions (D) form a two-dimensional arrangement having a fine period or size that is not visually recognizable by a naked human eye.

2. The substrate having a transparent conductive layer according to claim 1, wherein the two-dimensional arrangement formed by the subregions (C) and/or the subregions (D) has a repeat period of 100 µm or less.

3. The substrate having a transparent conductive layer according to claim 1, wherein the total area of the subregions (D) in the high-resistance region (B) is 70% or less of that of the high-resistance region (B), the subregions (D) being not covered with the transparent conductive film.

4. The substrate having a transparent conductive layer according to claim 1, wherein the conductive substance is fibrous conductive substance.

5. The substrate having a transparent conductive layer according to claim 4, wherein the fibrous conductive substance is nanowires.

6. The substrate having a transparent conductive layer according to claim 1, wherein the pattern on the transparent substrate is an electrode pattern, the conductive regions (A) are linear electrode line portions (a) extending in a fixed direction, the electrode line portions (a) being arranged in parallel to each other at regular intervals, and wherein the high-resistance region (B) is an electrode line-free portion (b) provided between the electrode lines.

7. The substrate having a transparent conductive layer according to claim 6, wherein the substrate having a transparent conductive layer is used for the production of a capacitive touch panel when the substrates having the transparent conductive layers are orthogonally bonded to each other, wherein electrode lines of the electrode line portions (a) each include electrode portions (a1) arranged at regular intervals and linking portions (a2) configured to connect the electrode portions to each other, and wherein the transparent conductive layer including the two-dimensional arrangement formed by the subregions (C) and/or the subregions (D) is provided in a region (b1) of the electrode line-free portion (b) where the electrode line-free portions (b) are superimposed on each other when the substrates are orthogonally superimposed in such a manner that the electrode portions are not superimposed and that the linking portions are superimposed on each other, the two-dimensional arrangement having a fine period or size that is not visually recognizable by a naked human eye.

8. The substrate having a transparent conductive layer according to claim 7, wherein the two-dimensional arrangement having a fine period or size that is not visually recognizable by a naked human eye is also provided in a region of the linking portions (a2) where the linking portions are superimposed on each other.

9. The substrate having a transparent conductive layer according to claim 7, wherein the subregions (C) and/or the subregions (D) form a repetitive pattern having a period of 100 µm or less.

10. The substrate having a transparent conductive layer according to claim 9, wherein the total area of the subregions (D) in the region (b1) where the electrode line-free portions (b) are superimposed on each other is 70% or less of that of the region (b1), the subregions (D) being not covered with the transparent conductive film.

11. The substrate having a transparent conductive layer according to claim 7, wherein the conductive substance is fibrous conductive substance.

12. The substrate having a transparent conductive layer according to claim 11, wherein the fibrous conductive substance is nanowires.

13. The substrate having a transparent conductive layer according to any one of claims 1 to 12, wherein the transparent conductive layer having the pattern is formed through an application step or a printing step using a coating material for a transparent conductive layer, the coating material containing a transparent conductive substance, the two-dimensional arrangement has a fine period that is not recognizable by a naked human eye, and the period is equal to a period of halftone dots of a plate used in application or printing.

14. The substrate having a transparent conductive layer according to any one of claims 1 to 12, wherein the pattern is formed by removing an unnecessary portion from a uniform transparent conductive layer formed on the transparent substrate.

15. The substrate having a transparent conductive layer according to claim 14, wherein the transparent conductive layer having the pattern is formed by forming the transparent conductive film on the entire surface of the transparent substrate by application and then detaching the unnecessary portion from the transparent conductive layer with a detachment base including an adhesive layer on a substrate, the adhesive layer having a negative pattern with respect to the pattern, wherein the adhesive layer is formed on the substrate through an application step or a printing step, the negative pattern has a fine period that is not recognizable by a naked human eye, the fine period corresponding to the two-dimensional arrangement, and wherein the period is equal to a period of halftone dots of a plate used in application or printing for the adhesive layer.

16. A transparent conductive film laminate for a touch panel, comprising a plurality of substrate having a transparent conductive layer according to any one of claims 1 to 12, the substrates being orthogonally bonded together.

17. A touch panel comprising the transparent conductive film laminate for a touch panel according to claim 16.

18. A method for producing a transparent substrate comprising a transparent conductive layer, the transparent conductive layer having a pattern, the transparent conductive layer being formed of a transparent conductive film containing a binder resin and a conductive substance, the method comprising applying a coating material for a transparent conductive layer onto a transparent substrate or printing an ink for a transparent conductive layer onto a transparent substrate using a plate, wherein the transparent conductive layer includes conductive regions (A) uniformly covered with the transparent conductive film and a high-resistance region (B) provided between the transparent conductive regions, wherein the high-resistance region (B) includes subregions (C) covered with the transparent conductive films and subregions (D) not covered with the transparent conductive film, wherein the subregions (C) and/or subregions (D) form a two-dimensional arrangement having a fine period or size that is not visually recognizable by a naked human eye, and wherein the plate includes a portion configured to perform printing for the regions (A) and a portion configured to perform printing for a region including the subregions (C) and the subregions (D) in the region (B).

19. The method according to claim 18, wherein the pattern on the transparent substrate is an electrode pattern, the conductive regions (A) are linear electrode line portions (a) extending in a fixed direction, the electrode line portions (a) being arranged in parallel to each other at regular intervals, and wherein the high-resistance region (B) is an electrode line-free portion (b) provided between the electrode lines.

20. The method according to claim 19, wherein the substrate having a transparent conductive layer is used for the production of a capacitive touch panel when the substrates having the transparent conductive layers are orthogonally bonded to each other, wherein electrode lines of the electrode line portions (a) each include electrode portions (a1) arranged at regular intervals and linking portions (a2) configured to connect the electrode portions to each other, and wherein the transparent conductive layer including the two-dimensional arrangement formed by the subregions (C) and/or the subregions (D) is provided in a region (b1) of the electrode line-free portion (b) where the electrode line-free portions (b) are superimposed on each other when the substrates are orthogonally superimposed in such a manner that the electrode portions are not superimposed and that the linking portions are superimposed on each other, the two-dimensional arrangement having a fine period or size that is not visually recognizable by a naked human eye.

21. The method according to claim 20, wherein the two-dimensional arrangement having a fine period or size that is not visually recognizable by a naked human eye is also provided in a region of the linking portions (a2) where the linking portions are superimposed on each other.

22. A method for producing a transparent substrate comprising a transparent conductive layer, the transparent conductive layer having a pattern, the transparent conductive layer being formed of a transparent conductive film containing a binder resin and a conductive substance, the method comprising forming the transparent conductive film on the entire surface of the transparent substrate and detaching an unnecessary portion from the transparent conductive layer using a detachment base including an adhesive layer on a substrate, the adhesive layer having a pattern that is the inverse, in terms of negative and positive portions, of the pattern of the transparent conductive layer, wherein the transparent conductive layer includes conductive regions (A) uniformly covered with the transparent conductive film and a high-resistance region (B) provided between the transparent conductive regions, wherein the high-resistance region (B) includes subregions (C) covered with the transparent conductive films and subregions (D) not covered with the transparent conductive film, wherein the subregions (C) and/or subregions (D) form a two-dimensional arrangement pattern having a fine period or size that is not visually recognizable by a naked human eye, and wherein in the production of the detachment base, the adhesive layer is formed on the substrate by application or printing with a plate including portions configured to perform printing for a negative pattern of the conductive regions (A) and a region including the subregions (C) and the subregions (D).

23. The method according to claim 22, wherein the two-dimensional arrangement having a fine period or size that is not visually recognizable by a naked human eye is also provided in a region of the linking portions (a2) where the linking portions are superimposed on each other, and wherein the plate further include a portion configured to perform printing for a negative pattern of the region.

24. The method according to any one of claims 18 to 23, wherein the conductive substance is fibrous conductive substance.

25. The method according to claim 24, wherein the fibrous conductive substance is nanowires.

* * * * *